(12) United States Patent
Chen et al.

(10) Patent No.: US 11,329,759 B2
(45) Date of Patent: May 10, 2022

(54) ELECTRONIC DEVICE, COMMUNICATION METHOD, DECRYPTION METHOD AND MEDIUM

(71) Applicant: Sony Corporation, Tokyo (JP)

(72) Inventors: Wei Chen, Beijing (CN); Yalei Wang, Beijing (CN); Xin Guo, Beijing (CN); Chen Sun, Beijing (CN)

(73) Assignee: SONY CORPORATION, Tokyo (JP)

( * ) Notice: Subject to any disclaimer, the term of this patent is extended or adjusted under 35 U.S.C. 154(b) by 59 days.

(21) Appl. No.: 16/969,195

(22) PCT Filed: May 29, 2019

(86) PCT No.: PCT/CN2019/088922
§ 371 (c)(1),
(2) Date: Aug. 12, 2020

(87) PCT Pub. No.: WO2019/228388
PCT Pub. Date: Dec. 5, 2019

(65) Prior Publication Data
US 2020/0374033 A1    Nov. 26, 2020

(30) Foreign Application Priority Data
May 31, 2018    (CN) .......................... 201810547604.6

(51) Int. Cl.
*H04L 1/18* (2006.01)
*H04L 1/00* (2006.01)
(Continued)

(52) U.S. Cl.
CPC .......... *H04L 1/0009* (2013.01); *G06N 10/00* (2019.01); *H04L 1/0014* (2013.01);
(Continued)

(58) Field of Classification Search
None
See application file for complete search history.

(56) References Cited

U.S. PATENT DOCUMENTS 7,102,552 B1 * 9/2006 Archbold ................ H03M 7/30
341/50
10,853,903 B1 * 12/2020 Deshmukh ............ G06T 1/0028
(Continued)

FOREIGN PATENT DOCUMENTS

| CN | 101001403 A | 7/2007 |
| CN | 106230555 A | 12/2016 |
| CN | 107888202 A | 4/2018 |

OTHER PUBLICATIONS

International Search Report and Written Opinion dated Sep. 3, 2019 for PCT/CN2019/088922 filed on May 29, 2019, 9 pages including English Translation of the International Search Report.
(Continued)

*Primary Examiner* — Mujtaba M Chaudry
(74) *Attorney, Agent, or Firm* — Xsensus LLP

(57) ABSTRACT

The present disclosure relates to electronic device, communication method, decoding method, and medium. There is provided an electronic device comprising processing circuitry. The processing circuitry is configured to determine a codec capability of at least one of a first communication apparatus and a second communication apparatus, wherein determining the codec capability comprises determining whether the codec capability comprises a capability of performing decoding process based on quantum computing. The processing circuitry is further configured to determine codec information for communication between the first communication apparatus and the second communication apparatus based on the codec capability.

18 Claims, 25 Drawing Sheets

(51) Int. Cl.
*G06N 10/00* (2022.01)
*H04W 28/18* (2009.01)
(52) U.S. Cl.
CPC .......... *H04L 1/0047* (2013.01); *H04L 1/0054* (2013.01); *H04W 28/18* (2013.01)

(56) References Cited

U.S. PATENT DOCUMENTS

| | | | |
|---|---|---|---|
| 2008/0140849 A1* | 6/2008 | Collazo | H04L 63/0428 709/229 |
| 2012/0027134 A1* | 2/2012 | Gladwin | G06F 21/6218 375/340 |
| 2017/0244429 A1 | 8/2017 | Hof et al. | |

OTHER PUBLICATIONS

Gal, B. L., et al., "Successive Cancellation Decoder for Very Long Polar Codes," 2017 IEEE International Workshop an Signal Processing Systems (SiPS), Nov. 16, 2017, 6 pages.

Wilde, M. M. and Renes, J. M., "Quantum polar codes for arbitrary channels," 2012 IEEE International Symposium on Information Theory Proceedings, Aug. 27, 2012, pp. 334-338.

* cited by examiner

ELECTRONIC DEVICE, COMMUNICATION METHOD, DECRYPTION METHOD AND MEDIUM

CROSS-REFERENCE TO RELATED APPLICATIONS

The present application is based on PCT filing PCT/CN2019/088922, filed May 29, 2019, which claims priority to P.R.C. patent application No. 201810547604.6, filed May 31, 2018, the entire contents of each which are incorporated herein by reference.

TECHNICAL FIELD

The present disclosure relates to electronic device, communication method, decoding method, and medium.

BACKGROUND

In the field of communication, encoding and decoding processes have been receiving much attention. There are many kinds of encoding methods and decoding methods. Depending on the encoding and decoding methods used, the processing flows at the transmitting end and receiving end will also change accordingly.

SUMMARY

The inventors of the present disclosure found that quantum computing can be applied to a decoding process. Based on this discovery, the present disclosure proposes an electronic device, a communication method, a decoding method, and a medium that are compatible with decoding processes based on quantum computing.

According to the present disclosure, there is provided an electronic device comprising processing circuitry. The processing circuitry is configured to determine a codec capability of at least one of a first communication apparatus and a second communication apparatus, wherein determining the codec capability comprises determining whether the codec capability comprises a capability of performing decoding process based on quantum computing. The processing circuitry is further configured to determine codec information for communication between the first communication apparatus and the second communication apparatus based on the codec capability.

In addition, according to the present disclosure, there is provided an electronic device comprising processing circuitry. The processing circuitry is configured to send information usable for determining a codec capability of a second communication apparatus to communicate with a first communication apparatus, wherein determining the codec capability comprises determining whether the codec capability comprises a capability of performing decoding process based on quantum computing. The processing circuitry is further configured to receive codec information for communication between the first communication apparatus and the second communication apparatus, wherein the codec information is determined based on at least the codec capability of the second communication apparatus.

In addition, according to the present disclosure, there is provided an electronic device comprising processing circuitry that performs the decoding process based on quantum computing. The processing circuitry is configured to map a plurality of metrics corresponding to a plurality of possible decoding results to a plurality of quantum states of a set of quantum registers. The processing circuitry is further configured to determine a maximum metric of the plurality of metrics mapped to the plurality of quantum states using quantum computing. The processing circuitry is further configured to determine a decoding result corresponding to the maximum metric as an optimum decoding result.

In addition, according to the present disclosure, there is provided a communication method. The communication method comprises determining a codec capability of at least one of a first communication apparatus and a second communication apparatus, wherein determining the codec capability comprises determining whether the codec capability comprises a capability of performing a decoding process based on quantum computing. The communication method further comprises determining codec information for communication between the first communication apparatus and the second communication apparatus based on the codec capability.

In addition, according to the present disclosure, there is provided a communication method. The communication method comprises sending information usable for determining a codec capability of a second communication apparatus to communicate with a first communication apparatus, wherein determining the codec capability comprises determining whether the codec capability comprises a capability of performing a decoding process based on quantum computing. The communication method further comprises receiving codec information for communication between the first communication apparatus and the second communication apparatus, wherein the codec information is determined based on at least the codec capability of the second communication apparatus.

In addition, according to the present disclosure, there is provided a decoding method based on quantum computing. The decoding method comprises mapping a plurality of metrics corresponding to a plurality of possible decoding results to a plurality of quantum states of a set of quantum registers. The decoding method further comprises determining a maximum metric of the plurality of metrics mapped to the plurality of quantum states using quantum computing. The decoding method further comprises determining a decoding result corresponding to the maximum metric as an optimum decoding result.

In addition, according to the present disclosure, there is provided a computer-readable storage medium with instructions stored thereon which when executed by a processor cause the processor to perform any of the above methods.

DRAWINGS

A better understanding of the present disclosure can be obtained when following detailed description of the embodiments is considered in conjunction with accompanying drawings. The same or similar reference numerals are used in the drawings to refer to the same or similar parts. The drawings, together with the specific description below, are included in and forms part of the specification, and are used to illustrate the embodiments of the present disclosure and explain the principles and advantages of the present disclosure.

Figure 1:
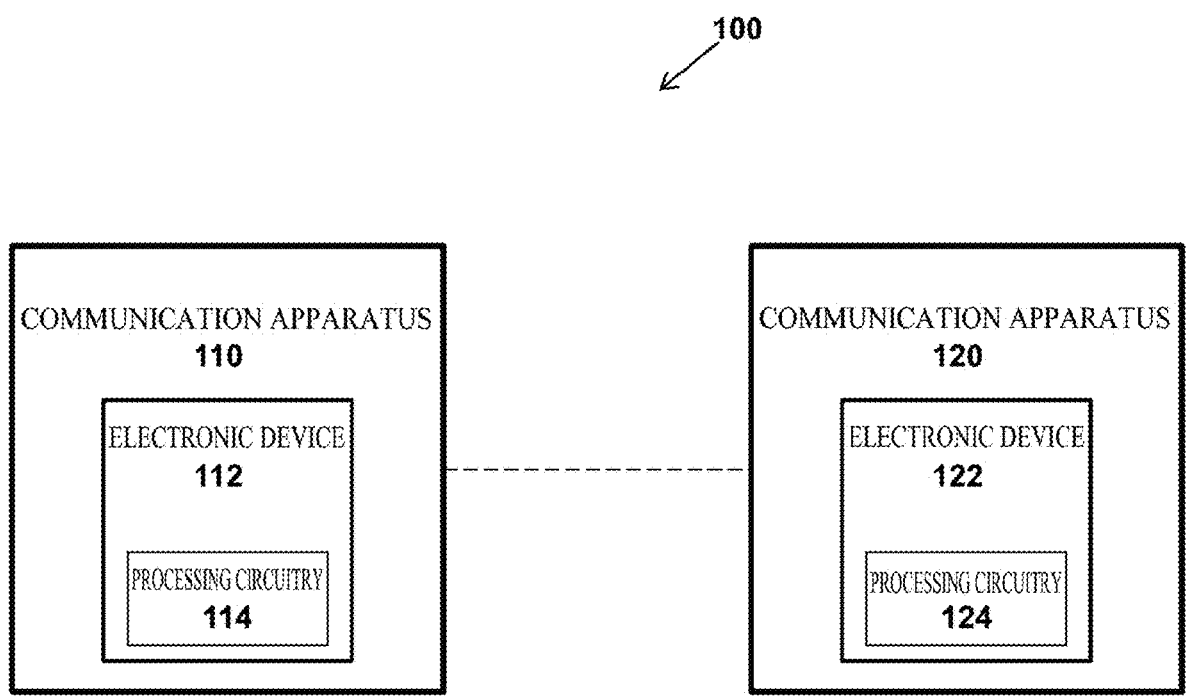
FIG. 1 illustrates a schematic diagram of a communication system according to some embodiments of the present disclosure.

In order to avoid obscuring the disclosure with unnecessary details, only the device structure and/or operation steps closely related to the solution according to the present disclosure are shown in the drawings, while other details that are not so relevant to the present disclosure are omitted.

DETAILED DESCRIPTION

Exemplary embodiments of the present disclosure will be described hereinafter with reference to the accompanying drawings. For clarity and conciseness, not all features of the actual implementations are described in the specification. However, it should be clear that implementation specific decisions must be made during the development of any such actual embodiment in order to achieve the developer's specific goals. For example, compliance with system and business related restrictions, and these restrictions may vary from implementation to implementation. Moreover, it should also be clear that while development work may be more complicated and time consuming, such development work is merely a routine task for those skilled in the art in light of the benefit of this disclosure.

While embodiments described in the present disclosure are susceptible to various modifications and alternative forms, the specific embodiments thereof are illustrated in the drawings as examples and are described in detail herein. It should be understood, however, the drawings and the detailed description thereof are not intended to limit the embodiments to the specific forms disclosed, rather, it is intended to cover all modifications, equivalents and alternatives falling within the spirit and scope of the claims.

In some embodiments, an electronic device comprises processing circuitry. The processing circuitry is configured to determine a codec capability of at least one of a first communication apparatus and a second communication apparatus, wherein determining the codec capability comprises determining whether the codec capability comprises a capability of performing decoding process based on quantum computing. The processing circuitry is further configured to determine codec information for communication between the first communication apparatus and the second communication apparatus based on the codec capability.

In a case where there is a communication apparatus that performs a decoding process based on quantum computing among communication apparatus that communicate with each other, by determining whether a communication apparatus has a capability of performing a decoding process based on quantum computing, and based on this, determining the corresponding codec information, thereby enabling compatible with decoding processes based on quantum computing.

<Examples of System Configuration>

FIG. 1 illustrates a schematic diagram of a communication system 100 according to some embodiments of the present disclosure. As illustrated in FIG. 1, the communication system 100 includes a communication apparatus 110 and a communication apparatus 120 that perform wireless communication with each other. Although one communication apparatus 110 and one communication apparatus 120 are illustrated communicating in FIG. 1, in some embodiments, the communication apparatus 110 communicates with multiple communication apparatus 120 and/or the communication apparatus 120 communicates with multiple communication apparatus 110.

As illustrated in FIG. 1, the communication apparatus 110 and 120 include electronic devices 112 and 122, respectively, and electronic devices 112 and 122 include processing circuitries 114 and 124, respectively.

In some embodiments according to the present disclosure, the processing circuitry 114 is configured to determine a codec capability of at least one of the communication apparatus 110 and the communication apparatus 120, wherein determining the codec capability comprises determining whether the codec capability comprises a capability of performing a decoding process based on quantum computing. The processing circuitry 114 is further configured to determine codec information for communication between the communication apparatus 110 and the communication apparatus 120 based on the codec capability.

In some embodiments according to the present disclosure, the processing circuitry 124 is configured to send information usable for determining a codec capability of a communication apparatus 120 to communicate with a communication apparatus 110, wherein determining the codec capability comprises determining whether the codec capability comprises a capability of performing a decoding process based on quantum computing. The processing circuitry 124 is further configured to receive codec information for communication between the communication apparatus 110 and the communication apparatus 120, wherein the codec information is determined based on at least the codec capability of the communication apparatus 120.

In some embodiments according to the present disclosure, the electronic devices 112 and/or 122 are configured to perform decoding process based on quantum computing. The processing circuitries 114 and/or 124 are configured to map a plurality of metrics corresponding to a plurality of possible decoding results to a plurality of quantum states of a set of quantum registers. The processing circuitries 114 and/or 124 are further configured to determine a maximum metric of the plurality of metrics mapped to the plurality of quantum states using quantum computing. The processing circuitries 114 and/or 124 are further configured to determine a decoding result corresponding to the maximum metric as an optimum decoding result.

In some embodiments according to the present disclosure, the communication apparatus 110, 120 also include other components not shown, such as one or more of antennas, radio frequency links, baseband processing units, network interfaces, processors, memories, controllers, etc.

In some embodiments according to the present disclosure, the electronic devices 112, 122 further include an input/output interface, a memory, and the like. In some embodiments, the processing circuitries 114, 124 in the electronic devices 112, 122 output/receive signals (digital or analog) to/from other components or external components in the communication apparatus 110, 120, respectively. Furthermore, in some embodiments, the processing circuitries 114, 124 control some or all operations of other components or external components in the communication apparatus 110, 120, respectively.

In some embodiments according to the present disclosure, the processing circuitries 114, 124 are in the form of general-purpose processors or dedicated processing circuitries, such as ASICs. In some embodiments, the processing circuitries 114, 124 can be constructed by a circuit (hardware) or a central processing device (such as a central processing unit (CPU)). In addition, in some embodiments, the processing circuitries 114, 124 carry a program (software) for operating a circuit (hardware) or a central processing device. The program can be stored in a memory (such as arranged in the communication apparatus 110, 120 or the electronic device 112, 122) or an external storage medium connected from the outside, and downloaded via a network (such as the Internet).

In some embodiments according to the present disclosure, the electronic devices 112, 122 are configured to chips (such as integrated circuit modules including a single wafer), hardware components, or complete products. In some embodiments, the electronic devices 112, 122 are configured to include one or more other components in the communication apparatus 110, 120, such as one or more of antennas, radio frequency links, baseband processing units, network interfaces, processors, memories, controllers, etc. In some embodiments, the electronic devices 112, 122 are configured as the communication apparatus 110, 120 themselves.

In some embodiments according to the present disclosure, the communication system 100 is configured to a cellular communication system, a machine type communication (MTC, Machine Type Communication) system, an ad hoc network, or a cognitive radio system (e.g., IEEE P802.19.1a and Spectrum Access System (SAS)), etc.

In some embodiments according to the present disclosure, one or both of the communication apparatus 110 and 120 are configured as terminal devices. In some embodiments according to the present disclosure, one or both of the communication apparatus 110 and 120 are configured as non-terminal devices. Examples of terminal device and non-terminal device will be described later.

The following describes the processing flows of the communication apparatus 110 and 120 according to some embodiments. Note that some or all of the processes executed by the communication apparatus 110 and 120 described below can be executed by the processing circuitries 114 and 124, or can be executed by other components and/or external components in the communication apparatus 110 and 120 under control of the processing circuitries 114 and 124.

<Examples of Processing Flows>

Figure 2:
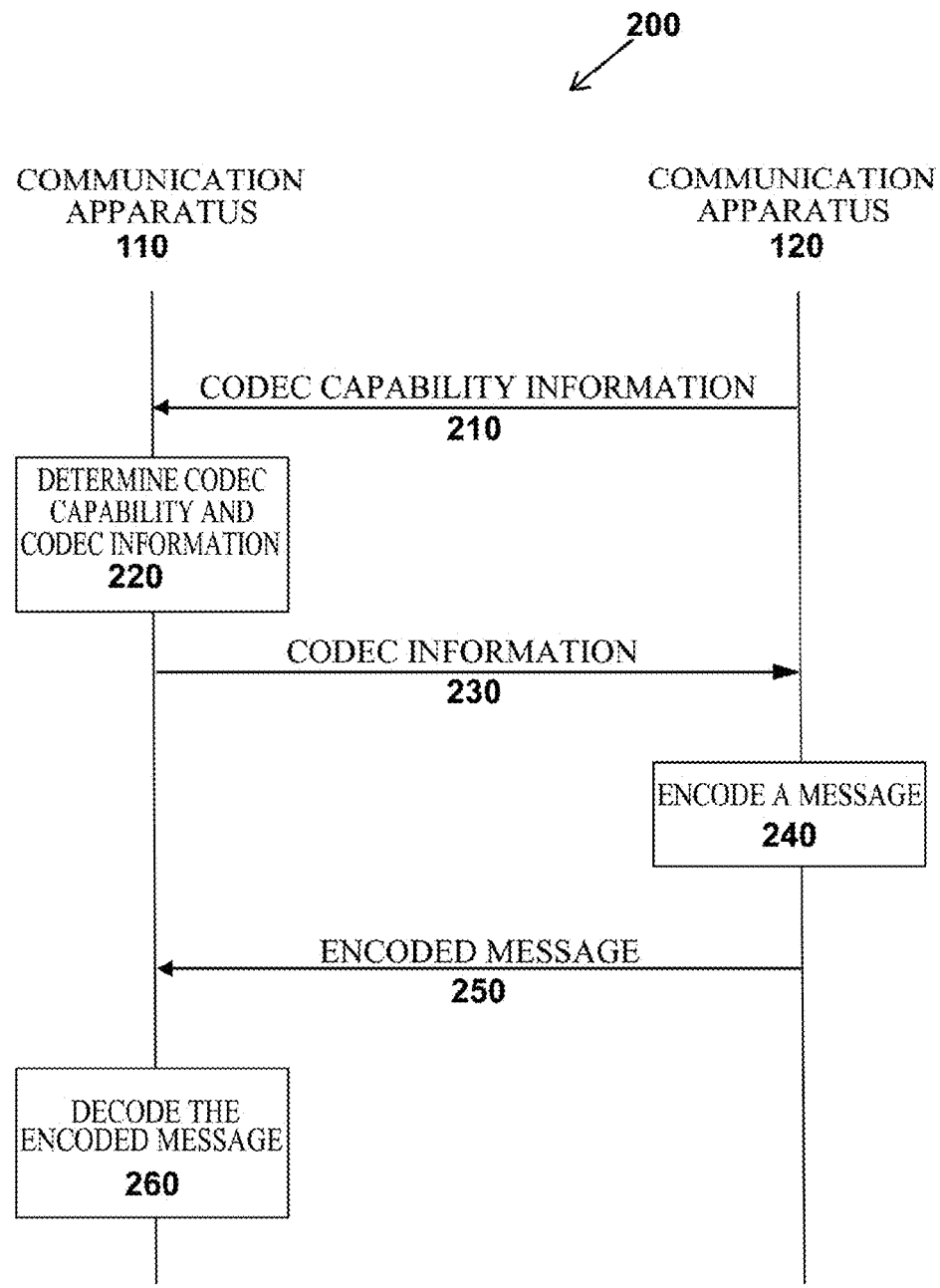
FIG. 2 is a flowchart illustrating a communication flow according to some embodiments of the present disclosure.

FIG. 2 is a flowchart illustrating a communication flow 200 between a communication apparatus 110 and a communication apparatus 120 according to some embodiments of the present disclosure.

In step 210, the communication apparatus 110 receives codec capability information of the communication apparatus 120, which can be used to determine a codec capability of the communication apparatus 120. In some embodiments, the codec capability information can be used to determine a maximum encoding length of the communication apparatus 120.

In some embodiments according to the present disclosure, the codec capability information is an index of codec capability. In some embodiments, the codec capability information is an index of apparatus type. For example, the communication apparatus 110 can determine the codec capability of the communication apparatus 120 according to the type of the communication apparatus 120.

In some implementations according to the present disclosure, codec capability information is stored in the communication apparatus 110 in advance, or sent to the communication apparatus 110 from an apparatus other than the communication apparatus 120.

In step 220, the communication apparatus 110 determines a codec capability of at least one of the communication apparatus 110 and the communication apparatus 120. The codec capability may include one or more of the maximum encoding length, the maximum decoding length, and the capability of performing decoding process based on quantum computing.

In some embodiments according to the present disclosure, the communication apparatus 110 determines whether it has the capability of performing decoding process based on quantum computing. In some embodiments, the communication apparatus 110 determines its own maximum decoding length.

In some embodiments according to the present disclosure, the communication apparatus 110 determines the codec capability of the communication apparatus 120 based on the codec capability information of the communication apparatus 120. In some embodiments, the communication apparatus 110 determines the maximum encoding length of the communication apparatus 120.

In step 220, the communication apparatus 110 also determines codec information for communication between the communication apparatus 110 and the communication apparatus 120 based on the determined codec capability. The codec information is information related to encoding and/or decoding of the communication between the communication apparatus 110 and the communication apparatus 120.

In some embodiments according to the present disclosure, the communication between the communication apparatus 110 and the communication apparatus 120 adopts a polar code coding method. The communication apparatus 110 determines the codec information and causes the codec information to indicate positions of message bits or freeze bits of the polar code.

In some embodiments according to the present disclosure, the codec information comprises a coding length for communication between the communication apparatus 110 and the communication apparatus 120. In some embodiments, the communication apparatus 110 determines a maximum encoding length of the communication apparatus 120, and determines the codec length to be shorter than or equal to the maximum encoding length of the communication apparatus 120. In some embodiments, the communication apparatus 110 determines its own maximum decoding length, and determines the codec length to be shorter than or equal to its own maximum decoding length.

In some embodiments according to the present disclosure, the codec information comprises a code length threshold for selecting a decoding process at the communication apparatus 110. A Maximum Likelihood decoding process is selected in a case where the coding length for the communication between the communication apparatus 110 and the communication apparatus 120 is shorter than or equal to the code length threshold, and a SC, SCL, or other decoding process is selected in a case where the coding length is greater than the code length threshold.

In some embodiments according to the present disclosure, the communication apparatus 110 determines the code length threshold as a first code length threshold for selecting the Maximum Likelihood decoding process based on quantum computing in a case where the communication apparatus 110 has a capability of performing the decoding process based on quantum computing. The Maximum Likelihood decoding process based on quantum computing is selected in a case where the coding length for communication between the communication apparatus 110 and the communication apparatus 120 is shorter than or equal to the first code length threshold.

In some embodiments according to the present disclosure, the communication apparatus 110 determines the code length threshold as a second code length threshold for selecting a classic Maximum Likelihood decoding process in a case where the communication apparatus 110 does not have a capability of performing decoding process based on quantum computing. The classic Maximum Likelihood decoding process is selected in a case where the coding length for communication between the communication apparatus 110 and the communication apparatus 120 is shorter than or equal to the second code length threshold.

In some embodiments according to the present disclosure, determining the codec information is also based on state of channel between the communication apparatus 110 and 120. In some embodiments according to the present disclosure, numbers and positions of message bits and freeze bits of polar codes are determined based on state of channel between the communication apparatus 110 and 120. In some embodiments according to the present disclosure, the coding length is determined based on state of channel between the communication apparatus 110 and 120.

Note that in this document, codec capability information comprises one or both of encoding capability information and decoding capability information, codec capability comprises one or both of encoding capability and decoding capability, and codec information comprises one or both of encoding information and decoded information.

In step 230, the communication apparatus 110 sends the determined codec information to the communication apparatus 120.

In step 240, the communication apparatus 120 encodes the message based on the received codec information. In some embodiments according to the present disclosure, the communication apparatus 120 places the information to be encoded at positions of message bits indicated by the codec information, or places the codec information at positions other than positions of frozen bits indicated by the codec information. In some embodiments according to the present disclosure, the communication apparatus 120 makes the code length of the message equal to the code length included in the codec information.

At step 250, the communication apparatus 120 sends the encoded message to the communication apparatus 110.

At step 260, the communication apparatus 110 decodes the encoded message. In some embodiments according to the present disclosure, the communication apparatus 110 may acquire message bits from positions of message bits indicated by the codec information, or from positions other than positions of frozen bits indicated by the codec information. Then, the communication apparatus 110 performs decoding process based on the acquired message bits.

In some embodiments according to the present disclosure, the communication apparatus 110 selects a decoding process according to a code length threshold. A Maximum Likelihood decoding process is selected in a case where the coding length for communication between the communication apparatus 110 and the communication apparatus 120 is shorter than or equal to the code length threshold, and a SC, SCL, or other decoding process is selected in a case where the coding length is greater than the code length threshold.

In some embodiments according to the present disclosure, the communication apparatus 110 selects a Maximum Likelihood decoding process based on quantum computing in a case where the communication apparatus 110 has a capability of performing decoding process based on quantum computing and the coding length is shorter than or equal to the first code length threshold.

In some embodiments, the communication apparatus 110 selects a classic Maximum Likelihood decoding process in a case where the communication apparatus 110 does not have a capability of performing decoding process based on quantum computing and the coding length is shorter than or equal to the second code length threshold.

Here, the encoded and decoded messages can be data or control signaling etc.

Figure 3:
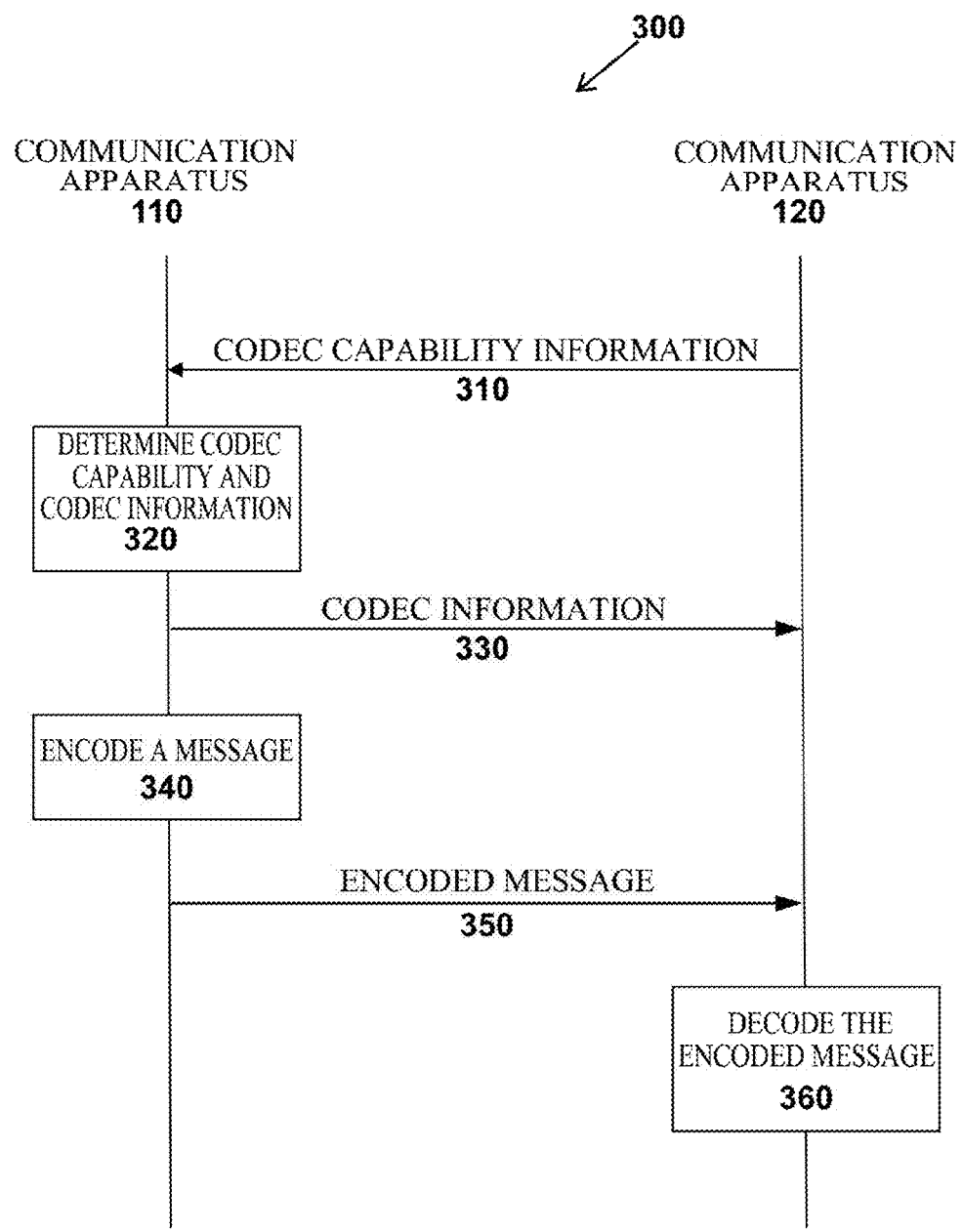
FIG. 3 is a flowchart illustrating a communication flow according to some embodiments of the present disclosure.

FIG. 3 is a flowchart illustrating a communication flow 300 between a communication apparatus 110 and a communication apparatus 120 according to some embodiments of the present disclosure.

In step 310, the communication apparatus 110 receives codec capability information of the communication apparatus 120, which can be used to determine a codec capability of the communication apparatus 120. In some embodiments according to the present disclosure, the codec capability information can be used to determine whether the communication apparatus 120 has a capability of decoding process based on quantum computing. In some embodiments according to the present disclosure, codec capability information can be used to determine a maximum decoding length of the communication apparatus 120.

In some embodiments according to the present disclosure, the codec capability information is an index of codec capability. In some embodiments according to the present disclosure, the codec capability information is an index of apparatus type. For example, the communication apparatus 110 can determine the codec capability of the communication apparatus 120 according to the type of the communication apparatus 120.

In some implementations according to the present disclosure, codec capability information is stored in the communication apparatus 110 in advance, or sent to the communication apparatus 110 from other device than the communication apparatus 120.

In step 320, the communication apparatus 110 determines a codec capability of at least one of the communication apparatus 110 and the communication apparatus 120. The codec capability may include one or more of the maximum encoding length, the maximum decoding length, and the capability of performing decoding process based on quantum computing.

In some embodiments according to the present disclosure, the communication apparatus determines the codec capability of the communication apparatus 120 based on the codec capability information of the communication apparatus 120. In some embodiments, the communication apparatus 110 determines whether the communication apparatus 120 has a capability of performing decoding process based on quantum computing. In some embodiments, the communication apparatus 110 determines the maximum decoding length of the communication apparatus 120.

In some embodiments according to the present disclosure, the communication apparatus 110 determines its own codec capability. In some embodiments, the communication apparatus 110 determines its own maximum encoding length.

In step 320, the communication apparatus 110 also determines codec information for communication between the communication apparatus 110 and the communication apparatus 120 based on the determined codec capability. The codec information is information related to encoding and/or decoding of communication between the communication apparatus 110 and the communication apparatus 120.

In some embodiments according to the present disclosure, a polar code coding method is adopted between the communication apparatus 110 and the communication apparatus 120. The communication apparatus 110 determines the codec information and causes the codec information to indicate positions of message bits or freeze bits of the polar code.

In some embodiments according to the present disclosure, the codec information comprises a coding length for communication between the communication apparatus 110 and the communication apparatus 120. In some embodiments according to the present disclosure, the communication apparatus 110 determines its own maximum encoding length, and determines the codec length to be shorter than or equal to its own maximum encoding length. In some embodiments according to the present disclosure, the communication apparatus 110 determines the maximum decoding length of the communication apparatus 120 and determines the codec length to be shorter than or equal to the maximum decoding length of the communication apparatus 120.

In some embodiments according to the present disclosure, the codec information comprises a code length threshold for selecting a decoding process at the communication apparatus 120. A Maximum Likelihood decoding process is selected in a case where the coding length for the communication between the communication apparatus 110 and the communication apparatus 120 is shorter than or equal to the code length threshold, and a SC, SCL, or other decoding process is selected in a case where the coding length is greater than the code length threshold.

In some embodiments according to the present disclosure, the communication apparatus 110 determines the code length threshold as a first code length threshold for selecting the Maximum Likelihood decoding process based on quantum computing in a case where the communication apparatus 120 has a capability of performing the decoding process based on quantum computing. The Maximum Likelihood decoding process based on quantum computing is selected in a case where the coding length for communication between the communication apparatus 110 and the communication apparatus 120 is shorter than or equal to the first code length threshold.

In some embodiments according to the present disclosure, the communication apparatus 110 determines the code length threshold as a second code length threshold for selecting a classic Maximum Likelihood decoding process in a case where the communication apparatus 120 does not have a capability of performing decoding process based on quantum computing. The classic Maximum Likelihood decoding process is selected in a case where the coding length for communication between the communication apparatus 110 and the communication apparatus 120 is shorter than or equal to the second code length threshold.

In some embodiments according to the present disclosure, determining the codec information is also based on state of channel between the communication apparatus 110 and 120. In some embodiments according to the present disclosure, numbers and positions of message bits and freeze bits of polar codes are determined based on state of channel between the communication apparatus 110 and 120. In some embodiments according to the present disclosure, the coding length is determined based on state of channel between the communication apparatus 110 and 120.

Note that in this document, codec capability information comprises one or both of encoding capability information and decoding capability information, codec capability comprises one or both of encoding capability and decoding capability, and codec information comprises one or both of encoding information and decoded information.

In step 330, the communication apparatus 110 sends the determined codec information to the communication apparatus 120.

In step 340, the communication apparatus 110 encodes the message based on the codec information, which is similar to step 240 in the communication flow 200.

In step 350, the communication apparatus 110 sends the encoded message to the communication apparatus 120.

In step 360, the communication apparatus 120 decodes the encoded message, which is similar to step 260 in the communication flow 200.

<Other Examples of System Configuration>

Figure 4:
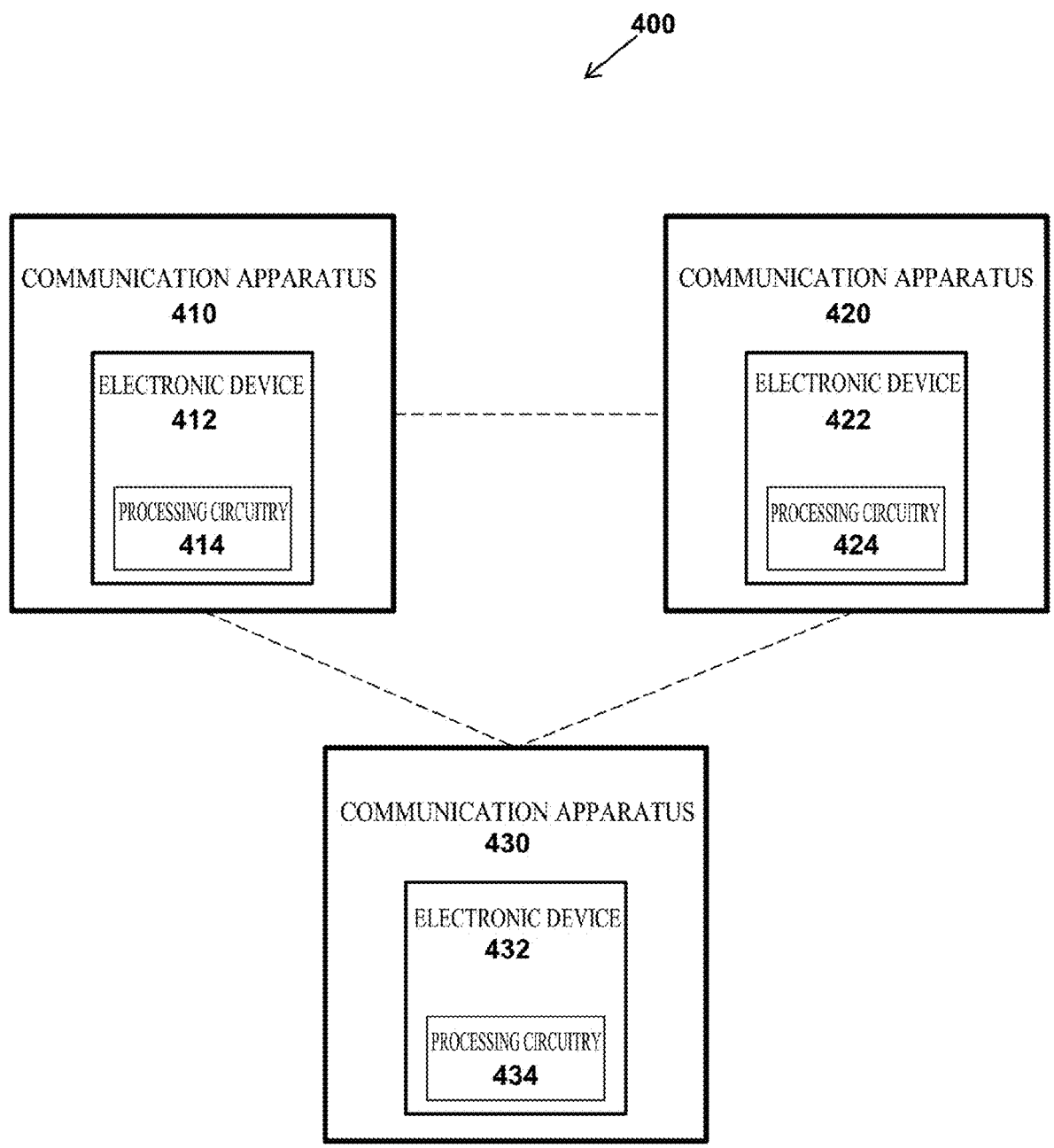
FIG. 4 is a schematic diagram illustrating a communication system according to some embodiments of the present disclosure.

FIG. 4 is a schematic diagram illustrating a communication system 400 according to some embodiments of the present disclosure. As illustrated in FIG. 4, the communication system 400 includes communication apparatus 410 and 420 that perform wireless communication with each other, and the communication apparatus 430 that performs wired or wireless communication with the communication apparatus 410 and 420. Although it is illustrated in FIG. 4 that the communication system 400 includes two communication apparatus (communication apparatus 410, 420) that perform wireless communication with each other, in some embodiments according to the present disclosure, the communication system 400 includes more communications device that perform wireless communication with each other, and the communication apparatus 430 performs wired or wireless communication with more communication apparatus. In some embodiments according to the present disclosure, the communication system 400 includes a plurality of communication apparatus 430, and the plurality of communication apparatus 430 may perform wired or wireless communication with each other.

As illustrated in FIG. 4, the communication apparatus 410, 420, and 430 include electronic devices 412, 422, and 432, respectively, and the electronic devices 412, 422, and 430 include processing circuitries 414, 424, and 434, respectively.

In some embodiments according to the present disclosure, the processing circuitry 414 is configured to determine the codec capability of at least one of the communication apparatus 410 and the communication apparatus 420, wherein determining the codec capability comprises determining whether the codec capability comprises a capability of performing decoding process based on quantum computing. The processing circuitry 414 is further configured to determine codec information for communication between the communication apparatus 410 and the communication apparatus 420 based on the codec capability.

In some embodiments according to the present disclosure, the processing circuitry 414 is configured to send information usable for determining a codec capability of a communication apparatus 410 to communicate with a communication apparatus 420, wherein determining the codec capability comprises determining whether the codec capability comprises a capability of performing decoding process based on quantum computing. The processing circuitry 414 is further configured to receive codec information for communication between the communication apparatus 410 and the communication apparatus 420, wherein the codec information is determined based on at least the codec capability of the communication apparatus 410.

In some embodiments according to the present disclosure, the processing circuitry 424 is configured to send information usable for determining a codec capability of a communication apparatus 420 that communicates with the communication apparatus 410, wherein determining the codec capability comprises determining the codec capability whether comprises a capability of performing decoding process based on quantum computing. The processing circuitry 424 is further configured to receive codec information for communication between the communication apparatus 410 and the communication apparatus 420, wherein the codec information is determined based on at least the codec capability of the communication apparatus 420.

In some embodiments according to the present disclosure, the electronic devices 412 and/or 422 are configured to perform decoding process based on quantum computing. The processing circuitries 414 and/or 424 are configured to map a plurality of metrics corresponding to a plurality of possible decoding results to a plurality of quantum states of a set of quantum registers. The processing circuitries 414 and/or 424 are further configured to determine a maximum metric of the plurality of metrics mapped to the plurality of quantum states using quantum computing. The processing circuitries 414 and/or 424 are further configured to determine a decoding result corresponding to the maximum metric as an optimum decoding result.

In some embodiments according to the present disclosure, the communication apparatus 410, 420, and 430 also include other components not shown, such as one or more of antennas, radio frequency links, baseband processing units, network interfaces, processors, memories, controllers etc.

In some embodiments according to the present disclosure, the electronic devices 412, 422, and 432 further include an input/output interface, a memory, and the like. In some embodiments, the processing circuitries 414, 424, and 434 in the electronic devices 412, 422, and 432 output/receive signals (digital or analog) to/from other components or external components in the communication apparatus 410, 420, and 430, respectively. In addition, in some embodiments according to the present disclosure, the processing circuitries 414, 424, and 434 control some or all operations of other components or external components in the communication apparatus 410, 420, and 430, respectively.

In some embodiments according to the present disclosure, the processing circuitries 414, 424, and 434 are in the form of general-purpose processors or dedicated processing circuitries, such as ASICs. In some embodiments, the processing circuitries 414, 424, and 434 can be constructed by circuits (hardware) or a central processing device (such as a central processing unit (CPU)). In addition, in some embodiments according to the present disclosure, the processing circuitries 414, 424, and 434 carry a program (software) for operating a circuit (hardware) or a central processing device. The program can be stored in a memory (such as arranged in the communication apparatus 410, 420, and 430 or the electronic devices 412, 422, and 432) or an external storage medium connected from the outside, and downloaded via a network (such as the Internet).

In some embodiments according to the present disclosure, the electronic devices 412, 422, and 432 are configured to chips (such as integrated circuit modules including a single wafer), hardware components, or complete products. In some embodiments according to the present disclosure, electronic devices 412, 422, and 432 are configured to include one or more other components in the communication apparatus 410, 420, and 430, such as one or more of antennas, radio frequency links, baseband processing units, network interfaces, processors, memories, controllers, etc. In some embodiments according to the present disclosure, the electronic devices 412, 422, and 432 are configured as the communication apparatus 410, 420, and 430, respectively.

In some embodiments according to the present disclosure, the communication system 400 is configured to a cellular communication system, a machine type communication (MTC, Machine Type Communication) system, an ad hoc network, or a cognitive radio system (e.g., IEEE P802.19.1a and Spectrum Access System (SAS)), etc.

In some embodiments according to the present disclosure, one or more of the communication apparatus 410, 420, and 430 are configured as terminal devices. In some embodiments according to the present disclosure, one or more of the communication apparatus 410, 420, and 430 are configured as non-terminal devices. Examples of terminal device and non-terminal device will be described later.

The following describes the processing flow of the communication apparatus 410, 420, and 430 according to some embodiments of the present disclosure. Note that part or all of the processes executed by the communication apparatus 410, 420, and 430 described below can be executed by the processing circuitries 414, 424, and 434, or can be executed by other components and/or external components in the communication apparatus 410, 420, and 430 under control of the processing circuitries 414, 424, and 434.

<Other Examples of Processing Flow>

Figure 5:
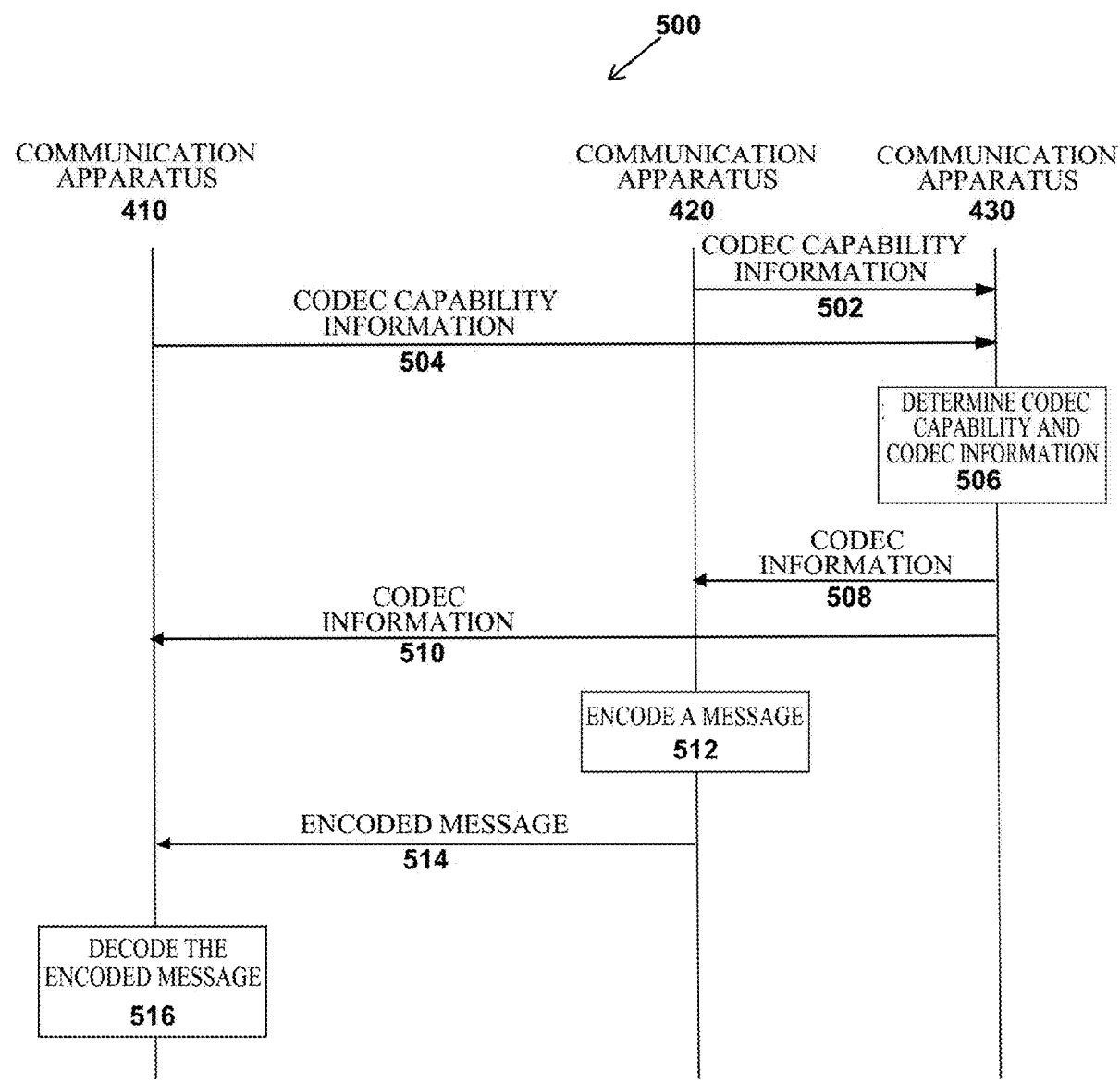
FIG. 5 is a flowchart illustrating a communication flow according to some embodiments of the present disclosure.

FIG. 5 is a flowchart illustrating a communication flow 500 between a communication apparatus 410, 420, and 430 according to some embodiments of the present disclosure.

In steps 502 and 504, the communication apparatus 430 receives codec capability information of the communication apparatus 410 and 420, which can be used to determine a codec capability of the communication apparatus 410 and 420.

In some embodiments according to the present disclosure, the codec capability information is an index of codec capability. In some embodiments according to the present disclosure, the codec capability information is an index of apparatus type. For example, the communication apparatus 430 can determine the codec capability of the communication apparatus 410, 420 according to the type of the communication apparatus 410, 420.

In some implementations according to the present disclosure, codec capability information is stored in the communication apparatus 430 in advance, or sent to the communication apparatus 430 from other apparatus than the communication apparatus 410, 420.

In step 506, the communication apparatus 430 determines a codec capability of at least one of the communication apparatus 410 and the communication apparatus 420. The codec capability may include one or more of the maximum encoding length, the maximum decoding length, and the capability of performing decoding process based on quantum computing.

In some embodiments according to the present disclosure, the communication apparatus 430 determines the codec capability of the corresponding communication apparatus based on the codec capability information.

In step 506, the communication apparatus 430 also determines codec information for communication between the communication apparatus 410 and the communication apparatus 420 based on the determined codec capability. The codec information is information related to encoding and/or decoding of communication between the communication apparatus 410 and the communication apparatus 420.

In some embodiments according to the present disclosure, the communication between the communication apparatus 410 and the communication apparatus 420 adopts a polar code coding method. The communication apparatus 430 determines the codec information and causes the codec information to indicate positions of message bits or freeze bits of the polar code.

In some embodiments according to the present disclosure, the codec information comprises a coding length for communication between the communication apparatus 410 and the communication apparatus 420. In some embodiments according to the present disclosure, the communication apparatus 430 determines a maximum encoding length of the communication apparatus 420, and determines the codec length to be shorter than or equal to the maximum encoding length of the communication apparatus 420. In some embodiments according to the present disclosure, the communication apparatus 430 determines the maximum decoding length of the communication apparatus 410, and determines the codec length to be shorter than or equal to the maximum decoding length of the communication apparatus 410.

In some embodiments according to the present disclosure, the codec information comprises a code length threshold for selecting a decoding process at the communication apparatus 410. A Maximum Likelihood decoding process is selected in a case where the coding length for communication between the communication apparatus 410 and the communication apparatus 420 is shorter than or equal to the code length threshold, and a SC, SCL, or other decoding is selected in a case where the coding length is greater than the code length threshold.

In some embodiments according to the present disclosure, the communication apparatus 430 determines the code length threshold as a first code length threshold for selecting the Maximum Likelihood decoding process based on quantum computing in a case where the communication apparatus 410 has a capability of performing the decoding process based on quantum computing. The Maximum Likelihood decoding process based on quantum computing is selected in a case where the coding length for communication between the communication apparatus 410 and the communication apparatus 420 is shorter than or equal to the first code length threshold.

In some embodiments according to the present disclosure, the communication apparatus 430 determines the code length threshold as a second code length threshold for selecting a classic Maximum Likelihood decoding process in a case where the communication apparatus 410 does not have a capability of performing decoding process based on quantum computing. The classic Maximum Likelihood decoding process is selected in a case where the coding length for communication between the communication apparatus 410 and the communication apparatus 420 is shorter than or equal to the second code length threshold.

In some embodiments according to the present disclosure, determining the codec information is also based on state of channel between the communication apparatus 410 and 420. In some embodiments according to the present disclosure, numbers and positions of message bits and freeze bits of the polar codes are determined based on state of channel between the communication apparatus 410 and 420. In some embodiments according to the present disclosure, the coding length is determined based on state of channel between the communication apparatus 410 and 420.

Note that in this document, codec capability information comprises one or both of encoding capability information and decoding capability information, codec capability comprises one or both of encoding capability and decoding capability, and codec information comprises one or both of encoding information and decoded information.

In steps 508 and 510, the communication apparatus 430 sends the determined codec information to the communication apparatus 410 and 420.

In step 512, the communication apparatus 420 encodes the message based on the received codec information, which is similar to step 240 in the communication flow 200.

In step 514, the communication apparatus 420 sends the encoded message to the communication apparatus 410.

In step 516, the communication apparatus 410 decodes the encoded message, which is similar to step 260 in the communication flow 200.

Figure 6:
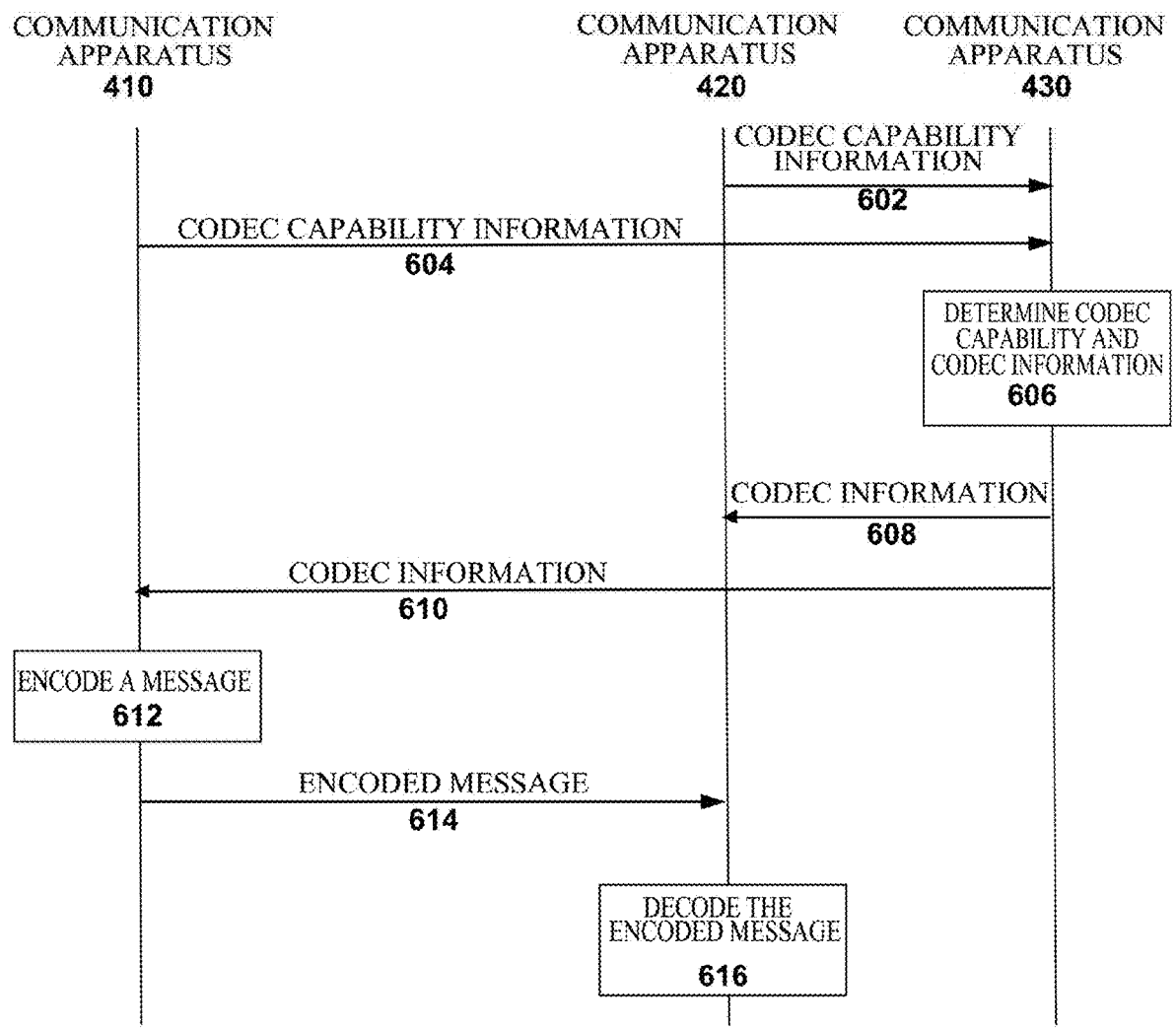
FIG. 6 is a flowchart illustrating a communication flow according to some embodiments of the present disclosure.

FIG. 6 is a flowchart illustrating a communication flow 600 between the communication apparatus 410, 420, and 430 according to some embodiments of the present disclosure. In the communication process 600, steps 602, 604, 606, 608, and 610 are similar to the steps 502, 504, 506, 508, and 510 in the communication process 500, respectively, so for the sake of simplicity, they will not be repeated here for again.

In step 612, the communication apparatus 410 encodes the message based on the received codec information, which is similar to step 240 in the communication flow 200.

In step 614, the communication apparatus 410 sends the encoded message to the communication apparatus 420.

In step 616, the communication apparatus 420 decodes the encoded message, which is similar to step 260 in the communication flow 200.

<Communication Method>

Figure 7:
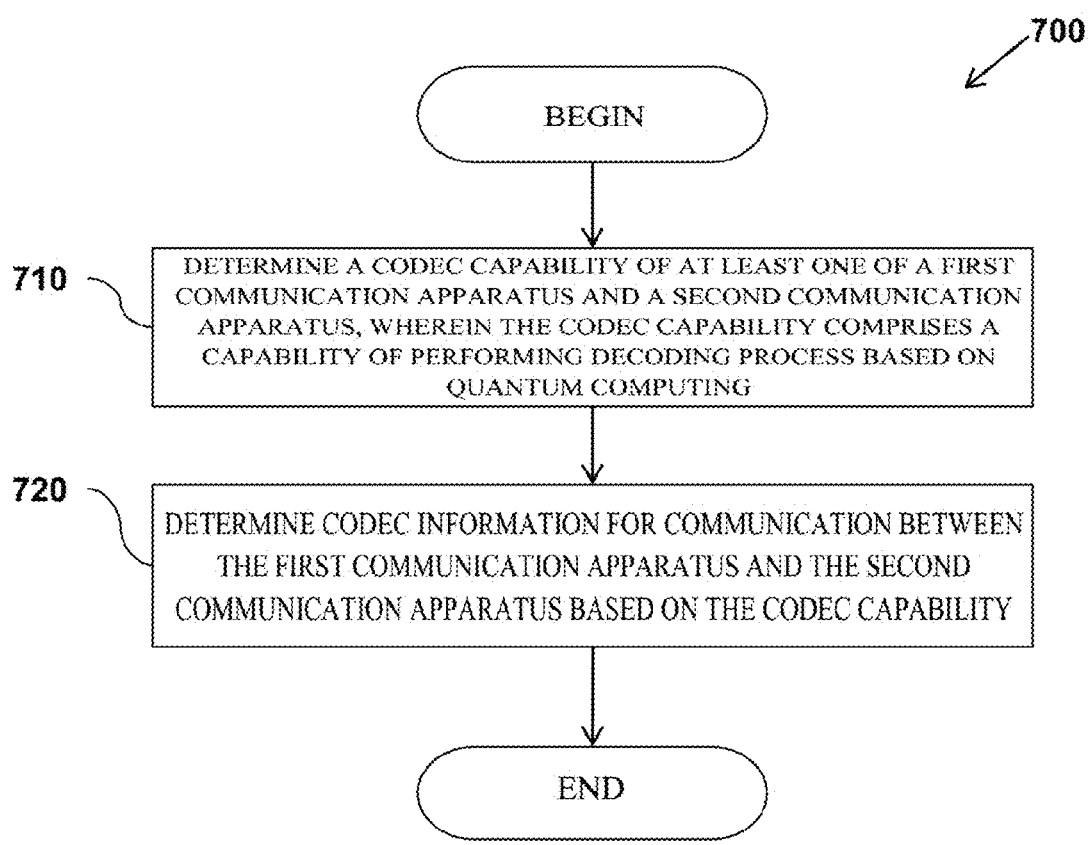
FIG. 7 is a flowchart illustrating a communication method according to some embodiments of the present disclosure.

FIG. 7 is a flowchart illustrating a communication method 700 according to some embodiments of the present disclosure. At step 710, a codec capability of at least one of a first communication apparatus and a second communication apparatus are determined, wherein the codec capability comprises a capability of performing decoding process based on quantum computing. At step 720, based on the codec capability, codec information for communication between the first communication apparatus and the second communication apparatus is determined. In some embodiments, the first communication apparatus is the communication apparatus 110 in FIG. 1 and the second communication apparatus is the communication apparatus 120 in FIG. 1. In some embodiments, the first communication apparatus is the communication apparatus 410 in FIG. 4 and the second communication apparatus is the communication apparatus 420 in FIG. 4.

Figure 8:
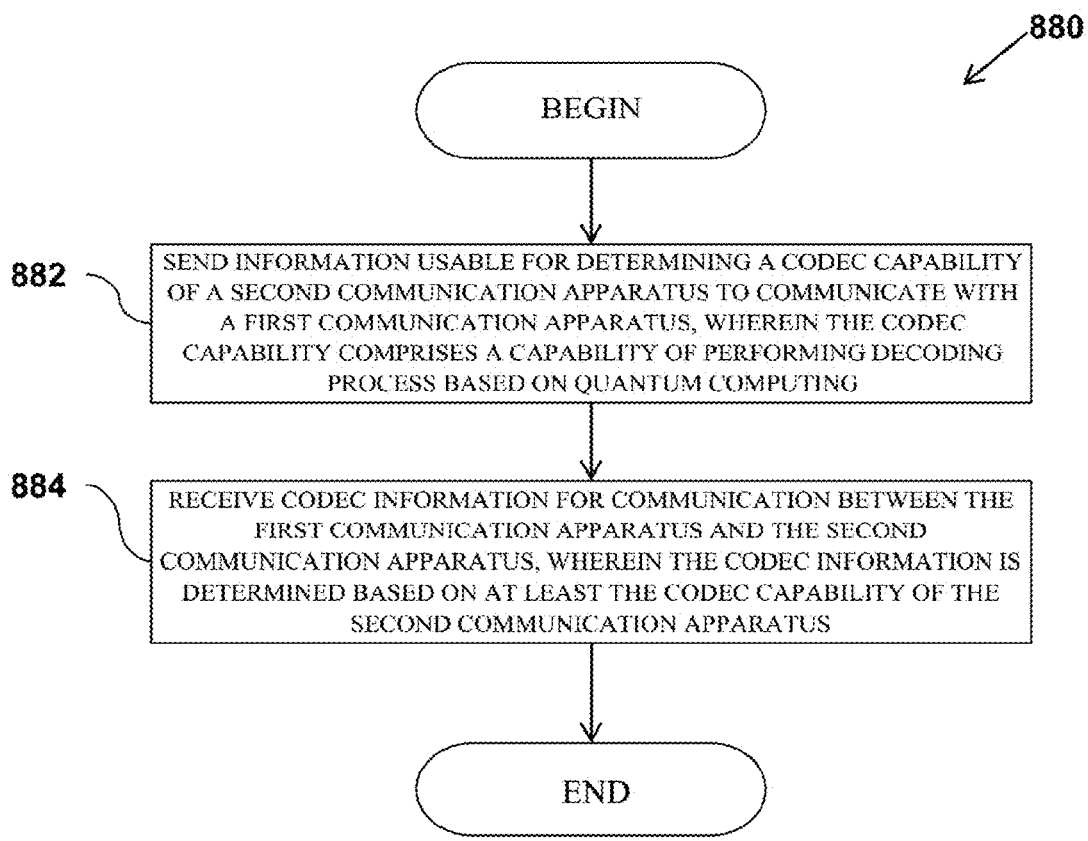
FIG. 8 is a flowchart illustrating a communication method according to some embodiments of the present disclosure.

FIG. 8 is a flowchart illustrating a communication method 880 according to some embodiments of the present disclosure. In step 882, information usable for determining a codec capability of a second communication apparatus to communicate with a first communication apparatus is sent, wherein the codec capability comprises a capability of performing decoding process based on quantum computing. At step 884, codec information for communication between the first communication apparatus and the second communication apparatus is received, wherein the codec information is determined based on at least the codec capability of the second communication apparatus. In some embodiments, the first communication apparatus is the communication apparatus 110 in FIG. 1 and the second communication apparatus is the communication apparatus 120 in FIG. 1. In some embodiments, the first communication apparatus is the communication apparatus 410 in FIG. 4 and the second communication apparatus is the communication apparatus 420 in FIG. 4.

The specific details of the communication method 700 and the communication method 880 have been described in detail hereinabove when explaining the communication processes 200, 300, 500, 600, so for the sake of simplicity, they will not be repeated here again.

Figure 9:
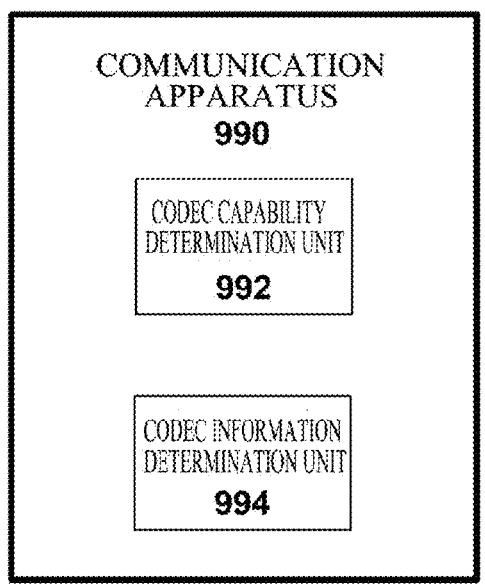
FIG. 9 is a schematic diagram illustrating a configuration of a communication apparatus according to some embodiments of the present disclosure.

FIG. 9 is a schematic diagram illustrating a configuration of a communication apparatus 990 according to some embodiments of the present disclosure. In some embodiments, the communication apparatus 990 operates as the communication apparatus 110 in FIG. 1 or the communication apparatus 430 in FIG. 4.

As illustrated in FIG. 9, the communication apparatus 990 includes a codec capability determination unit 992 and a codec information determination unit 994. The codec capability determination unit 992 is configured to perform the process of step 710 of the communication method 700. The codec information determination unit 994 is configured to perform the process of step 720 of the communication method 700.

Figure 10:
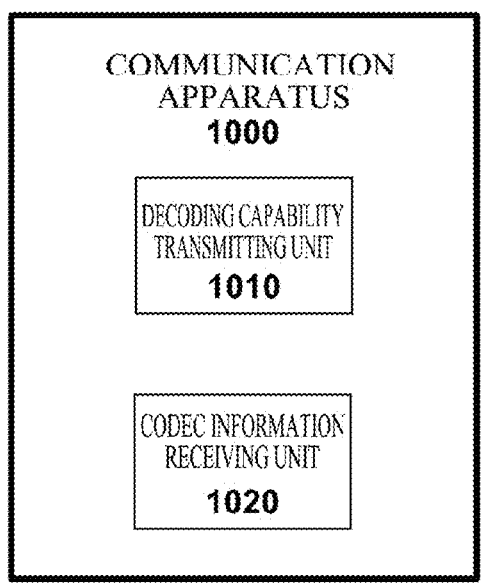
FIG. 10 is a schematic diagram illustrating a configuration of a communication apparatus according to some embodiments of the present disclosure.

FIG. 10 is a schematic diagram showing a configuration of a communication apparatus 1000 according to some embodiments of the present disclosure. In some embodiments, the communication apparatus 1000 operates as the communication apparatus 120 in FIG. 1 or the communication apparatus 410, 420 in FIG. 4.

As illustrated in FIG. 10, the communication apparatus 1000 includes a codec capability transmitting unit 1010 and a codec information receiving unit 1020. The decoding capability transmitting unit 1010 is configured to perform the process of step 882 of the communication method 880. The codec information receiving unit 1020 is configured to perform the process of step 884 of the communication method 880.

The system configurations, communication flows and methods according to some embodiments are described above. Note that not all the steps in the above communication flows and methods are necessary and those skilled in the art may omit one or more steps according to design requirements. In addition, the orders among the steps of the above communication flows and method are not limited to the orders illustrated in the drawings, but may be changed according to design requirements. Some specific details in the above system configuration and communication flow will be described below.

<Coding Processes>

In some embodiments of the present disclosure, communication between the communication apparatus 110 and the communication apparatus 120 or communication between the communication apparatus 410 and the communication apparatus 420 adopts a polar code coding method. Polar Code is a linear block error correction code. Code construction is based on converting physical channels into multiple recursive cascades of short kernel code of virtual external channels. When the number of recursion becomes larger, virtual channels tend to have high reliability or low reliability (in other words, they are polarized), and the data bits are allocated to the most reliable channel. Polar code is a coding method that can realize the capacity of symmetric binary-input, discrete, memoryless channels (B-DMC) and binary erasure channels (BEC). For 5G technology, Polar Codes attracted great attention due to its low complexity and high performance.

Polar Codes include Message Bits and Frozen Bits. Positions of the polar codes corresponding to message bits contain information and are bits that change according to the information. Positions of the polar codes corresponding to the frozen bits contain no information and are fixed bits (generally chose as 0).

In some embodiments of the present disclosure, communication between the communication apparatus 110 and the communication apparatus 120 or communication between the communication apparatus 410 and the communication apparatus 420 adopts other coding methods.

Decoding Process

In some embodiments of the present disclosure, a classic Maximum Likelihood (ML) decoding process is adopted. The complexity of the classic ML decoding process is $O(2^N)$, which increases exponentially as the code length N increases.

In some embodiments of the present disclosure, a classic Successive Cancellation (SC) decoding process is adapted. The classic SC decoding process is described in the document Arikan E. "Channel Polarization: A Method for Constructing Capacity-Achieving Codes for Symmetric Binary-Input Memoryless Channels[J]." IEEE Transactions on Information Theory, 2009, 55(7): 3051-3073, the entire contents of which are incorporated herein by reference. The complexity of the classic SC decoding process is O(N log N), which is much lower than that of the classic ML decoding process, and also the bit error rate is relatively low under the condition of high signal-to-noise ratio.

In some embodiments of the present disclosure, a classic Successive Cancellation List (SCL) decoding process is adapted. The classic SCL decoding process is described in the document Tal I, Vardy A. "List Decoding of Polar Codes [J]." IEEE Transactions on Information Theory, 2015, 61(5): 2213-2226, the entire contents of which are incorporated herein by reference. The classic SCL decoding process introduces a list of length L on the basis of the classic SC decoding process to store the most likely L decoding paths.

The complexity of the classic SCL decoding process is O(L·N log N). The complexity of the classic SCL decoding process depends on the list length L, which increases as the list length L increases. When L=1, the error rate and complexity of the classic SCL decoding process are equivalent to the classic SC decoding process. When $L=2^N$ (N is the code length), the error rate and complexity of the classic SCL decoding process are equivalent to the classic ML decoding process.

The bit error rate of the classic SCL decoding process depends on the channel conditions. Under high signal-to-noise ratio, the classic SCL decoding process has a low bit error rate, and even close to the classic ML decoding process. Under the condition of low signal-to-noise ratio, the error rate of classic SCL decoding process is quite different from that of classic ML decoding. In addition, the error rate of the classic SCL decoding process depends on the list length L. The longer the list length L is, the lower its bit error rate. Under a given computing power, some methods reduce the bit error rate of the SCL decoding process by increasing the list length L.

Figure 11:
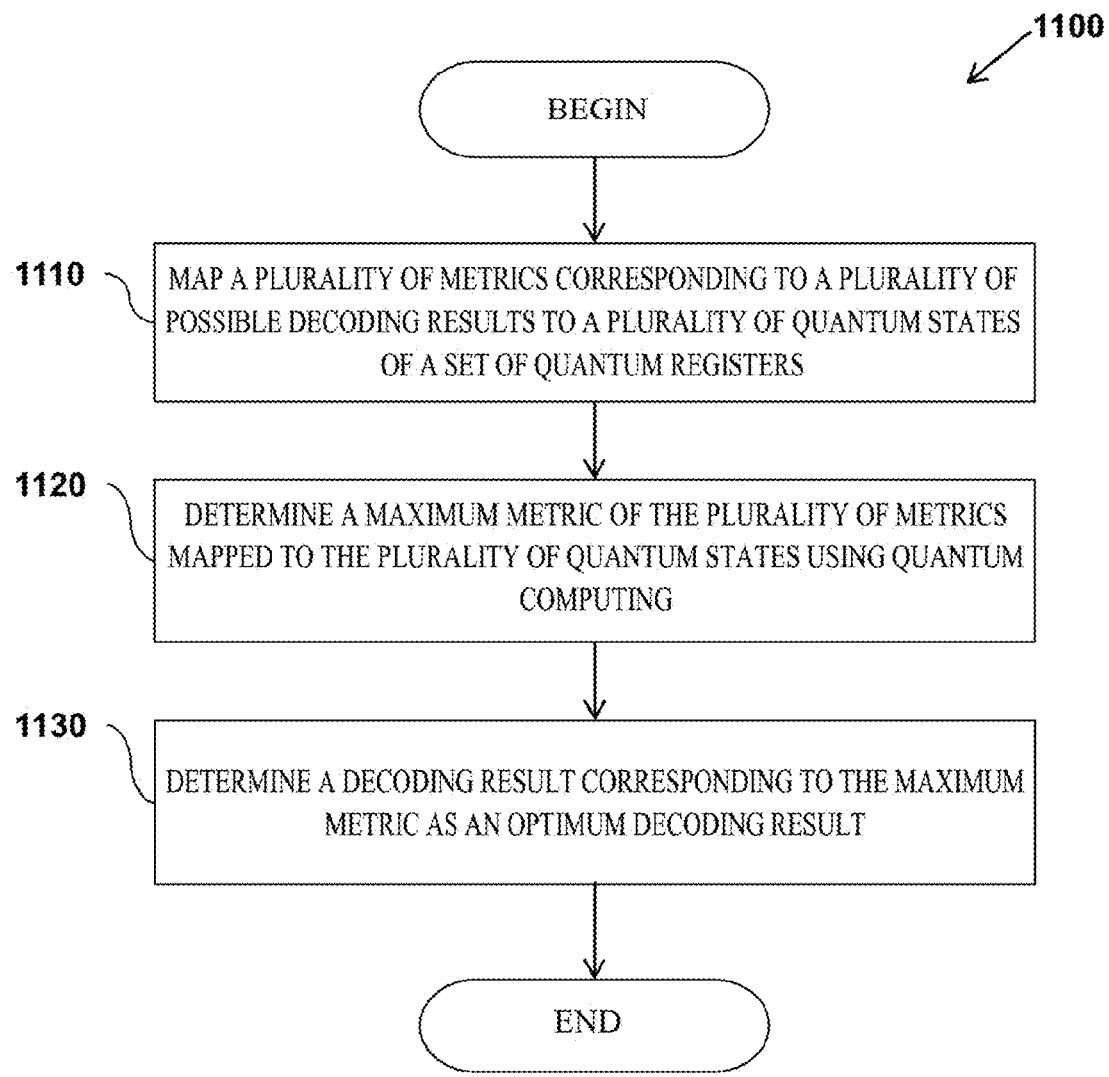
FIG. 11 is a flowchart illustrating a decoding process based on quantum computing according to some embodiments of the present disclosure.

In some embodiments of the present disclosure, a decoding process based on quantum computing is adapted. FIG. 11 is a flowchart illustrating a decoding process 1100 based on quantum computing according to some embodiments of the present disclosure. In step 1110, a plurality of metrics corresponding to a plurality of possible decoding results is mapped to a plurality of quantum states of a set of quantum registers. At step 1120, a maximum metric of the plurality of metrics mapped to the plurality of quantum states is determined using quantum computing. In step 1130, a decoding result corresponding to the maximum metric is determined as an optimum decoding result.

In a ML decoding process based on quantum computing according to some embodiments of the present disclosure, a codeword with a code length of N has $2^N$ possible decoded bit sequences, and one metric T is assigned to each of these possible decoded bit sequences, to reflect a probability that its corresponding decoded bit sequence is consistent with the bit sequence before encoding. The metric of a ML decoding process based on quantum computing according to some embodiments of the present disclosure adopts the metric of a classic ML decoding process, i.e., the posterior probability of each decoded bit sequence.

In a SCL decoding process based on quantum computing according to some embodiments of the present disclosure, there are multiple possible decoding paths each time one or more layers are searched downward in the decoding tree. One metric T is given to each of these possible decoding paths, to reflect the probability that the decoded bit sequence that can be obtained through its corresponding decoding path is consistent with the bit sequence before encoding. The metric of a SCL decoding process based on quantum computing according to some embodiments of the present disclosure adopts the metric of a classic SCL decoding process.

A decoding process based on quantum computing combines quantum computing with decoding process, reducing decoding complexity. A decoding process based on quantum computing includes a ML decoding process based on quantum computing and a SCL decoding process based on quantum computing, etc. In some embodiments of the present disclosure, a ML decoding process based on quantum computing finds a maximum metric among all possible decoding results. In some embodiments of the present disclosure, a SCL decoding process based on quantum computing finds a maximum metric in a subset of all possible decoding results, and performs step 1120 multiple times.

In the following, the details of a ML decoding process based on quantum computing and a SCL decoding process based on quantum computing will be described in detail.

Figure 12:
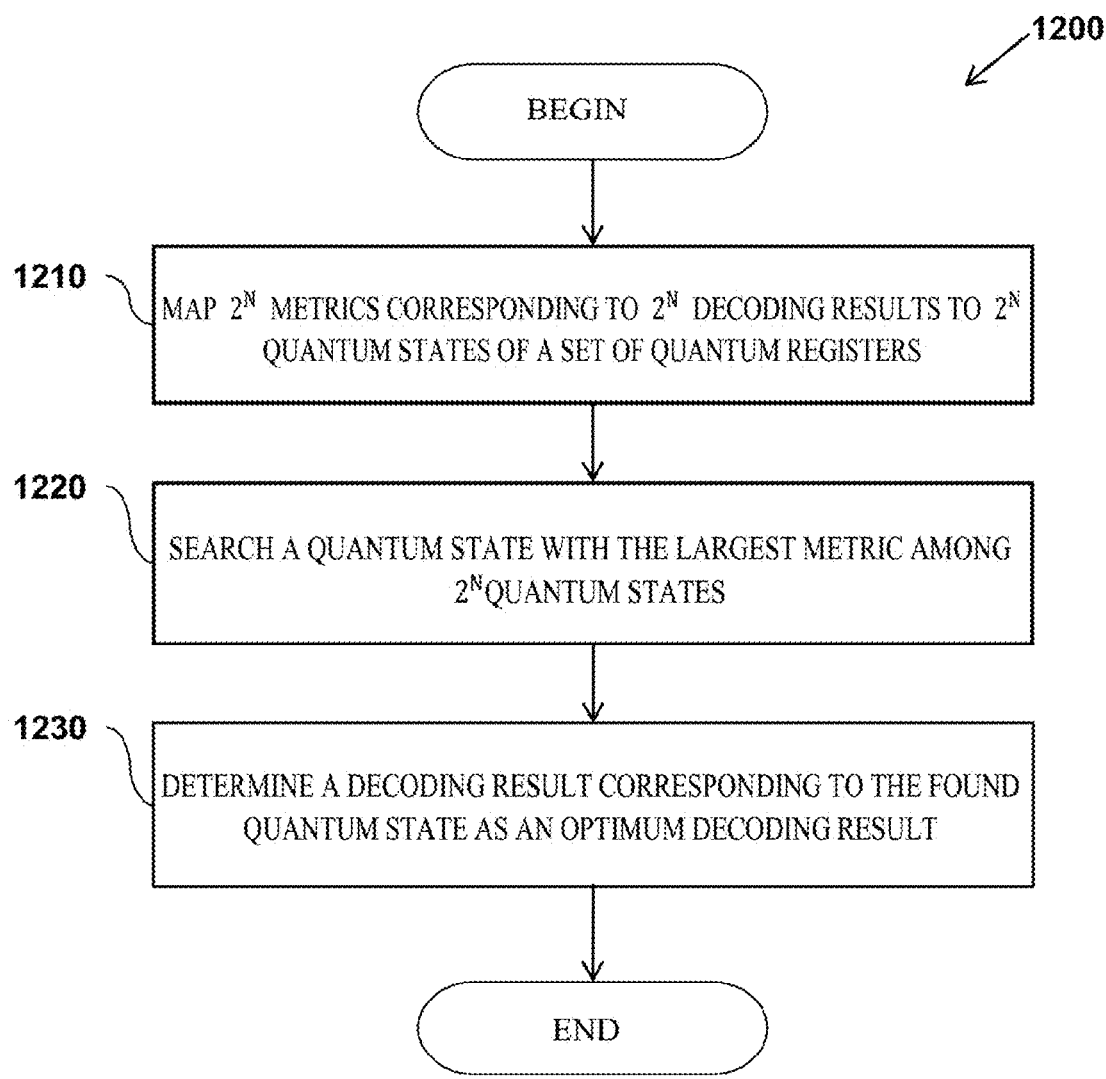
FIG. 12 is a flowchart illustrating a ML decoding process based on quantum computing according to some embodiments of the present disclosure.

FIG. 12 is a flowchart illustrating a ML decoding process 1200 based on quantum computing according to some embodiments of the present disclosure. In step 1210, $2^N$ metrics corresponding to $2^N$ decoding results are mapped to $2^N$ quantum states of a set of quantum registers. In step 1220, a quantum state with the largest metric among $2^N$ quantum states is searched. In step 1230, a decoding result corresponding to the found quantum state is determined as an optimum decoding result.

In some embodiments of the present disclosure, step 1220 may be implemented as follows: 1) searching a quantum state with the largest metric among $2^N$ quantum states with probability $P_0$ (not less than 0.5); 2) performing step 3) s times to obtain s quantum states; c) determining a quantum state with the largest metric among the s quantum states.

The probability that the quantum state determined in step 1220 has the largest metric among $2^N$ metrics is $P_{max}=1-(1-P_O)^s \geq 1-(1-0.5)^s$. An appropriate s can be chosen to cause $P_{max}$ to be close to 1. Actually, when s≥10, $P_{max} \geq 0.999$.

Figure 13:
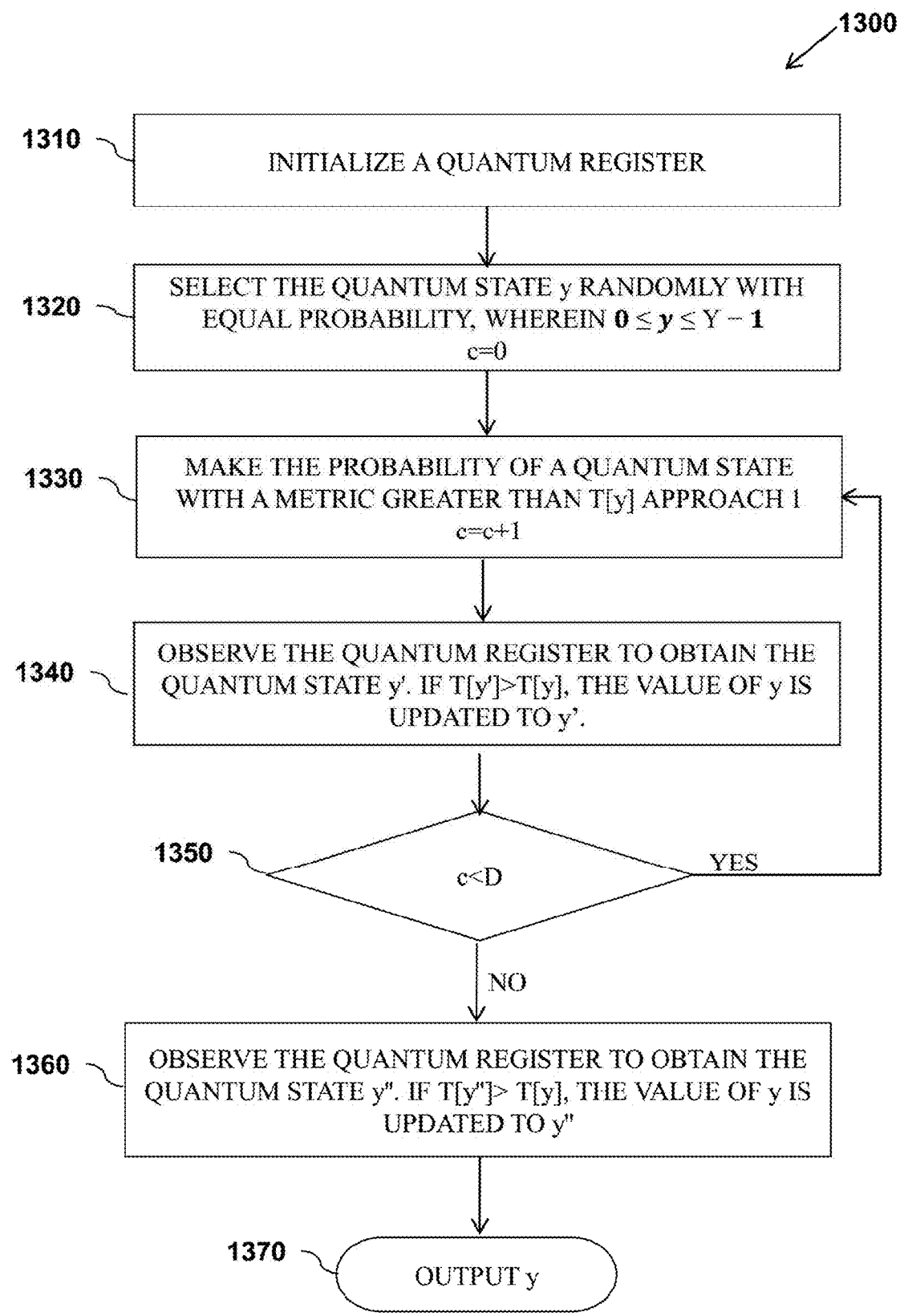
FIG. 13 is a flowchart illustrating a process of searching a quantum state with a maximum metric among a plurality of quantum states with a probability of not less than 0.5 according to some embodiments of the present disclosure.

FIG. 13 is a flowchart illustrating a process 1300 for searching a quantum state with a maximum metric among a plurality of quantum states with a probability of not less than 0.5 according to some embodiments of the present disclosure.

At step 1310, a quantum register is initialized so that it is in Y quantum states with equal probability, with each quantum state having a corresponding metric T. Let $Y=2^N$, so that $2^N$ quantum states have $2^N$ metrics of the ML decoding process, then the process 1300 can be used to implement the above step 1) of the ML decoding process.

In step 1320, the quantum state y is randomly selected from the Y quantum states with equal probability, and the metric T[y] of the quantum state y is used as a threshold, wherein 0≤y≤Y−1.

At step 1330, the probability of a quantum state satisfying the metric greater than T[y] is made approaching 1. In some embodiments of the present disclosure, the probability of a quantum state with a metric greater than T[y] is made approaching 1 by changing (e.g., increasing) the probability of a quantum state with a metric greater than T[y] multiple times. In some embodiments of the present disclosure, the probability of a quantum state with a metric greater than T[y] is changed (e.g., increased) by using a Grover algorithm, and the Grover algorithm is executed a certain number of times to implement step 1330. In some embodiments of the present disclosure, the quantum Oracle in the Grover algorithm has the following form:

$$f_{T[y]}(T[x]) = \begin{cases} 1, & T[x] > T[y] \\ 0, & T[x] \leq T[y] \end{cases},$$

wherein x is a quantum state.

The Grover algorithm is described in the document Grover L K. "A fast quantum mechanical algorithm for database search[C]//" Proc. ACM Symposium on the Theory of Computing. 1996:212-219, the entire contents of which are incorporated herein by reference. By making the quantum Oracle of the Grover algorithm have the above-described form, it is possible to make the probability of a quantum state having metric greater than T[y] among Y quantum states change (for example, increase) with complexity $O(\sqrt{Y})$.

At step 1340, the quantum register is observed to obtain the quantum state y'. If T[y']>T[y], the value of y is updated to y'.

In step 1350, it is determined whether steps 1330 and 1340 have been executed D times. If steps 1330 and 1340 have not been executed D times, then steps 1330 and 1340 are executed again. If steps 1330 and 1340 have been executed D times, then proceed to step 1360. In some embodiments of the present disclosure, D is set to $22.5\sqrt{Y}+1.4 \log Y$.

In step 1360, the quantum register is observed to obtain the quantum state y". If T[y"]>T[y], update the value of y to y".

At step 1370, y is output. The metric T[y] of the quantum state y is the probability that the quantum state with the largest metric among the Y quantum states is not less than 0.5.

Figure 14:
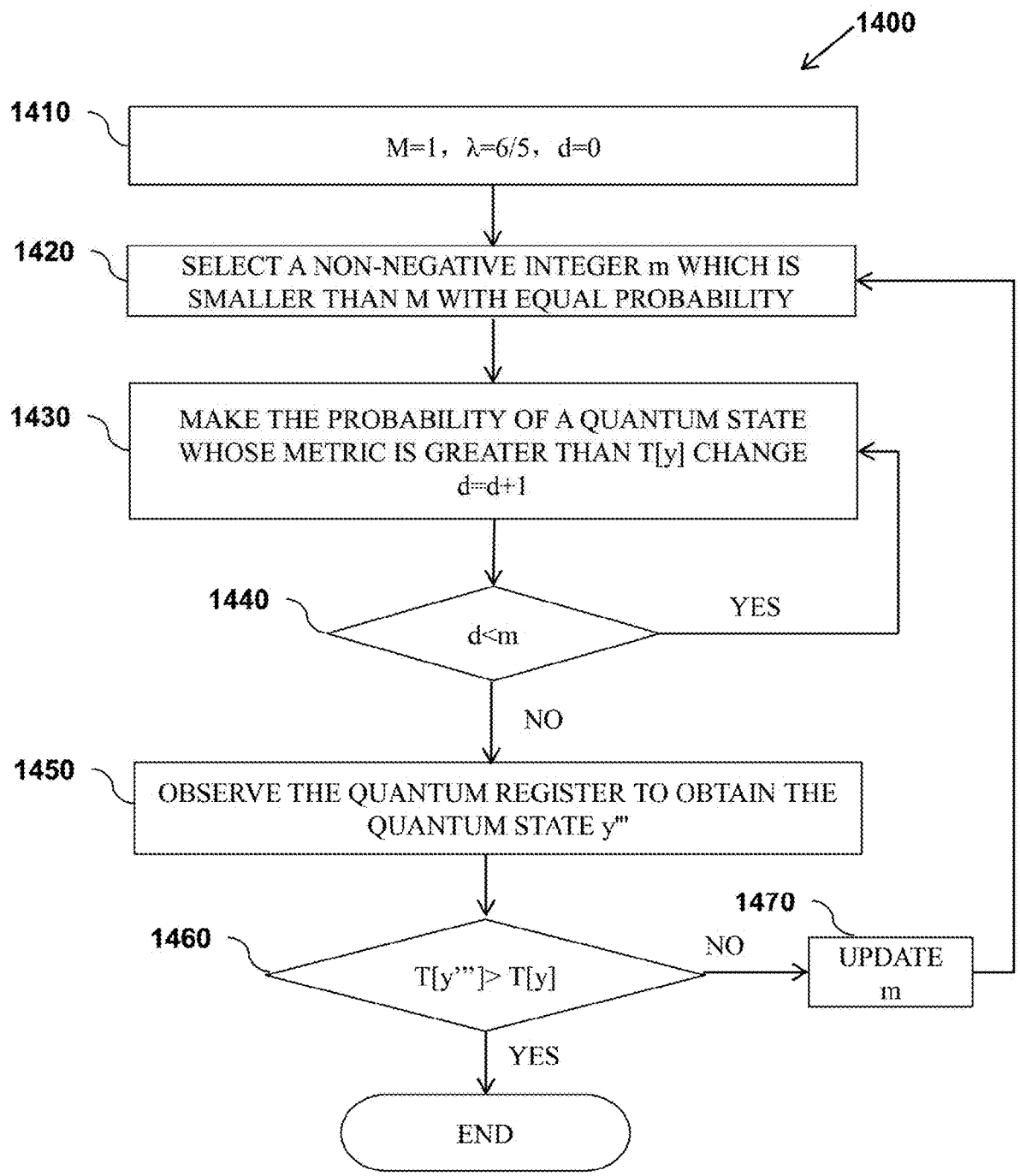
FIG. 14 is a flowchart illustrating a process of making the probability of a quantum state that satisfies the metric greater than T[y] approaches 1, according to some embodiments of the present disclosure.

FIG. 14 is a flowchart illustrating a process 1400 of making the probability of a quantum state that satisfies the metric greater than T[y] approaches 1, according to some embodiments of the present disclosure. The process 1400 makes the probability of quantum states whose metric is greater than T[y] approach 1 by controlling the number of executions of the Grover algorithm.

At step 1410, M and λ, are initialized so that M=1 and λ=6/5. In step 1420, a non-negative integer m which is smaller than M is selected with equal probability.

At step 1430, the probability of a quantum state whose metric is greater than T[y] changes (e.g., increases). In some embodiments of the present disclosure, at step 1430, the Grover algorithm is used so that the probability of a quantum state whose metric is greater than T[y] changes (e.g., increases).

At step 1440, it is determined whether step 1420 has been executed m times. If step 1420 has not been executed m times, then step 1420 is executed again. If step 1420 has been executed m times, then proceed to step 1450.

In step 1450, the quantum register is observed to obtain the quantum state y'''. In step 1460, it is determined whether the metric T[y'''] of the quantum state y''' is greater than T[y]. If T[y''']>T[y], the process 1400 ends. Otherwise, proceed to step 1470. At step 1470, the value of M is updated to min $(\lambda M, \sqrt{Y})$ (i.e., make the value of M greater), and then return to step 1420.

The process 1400 can make the probability of quantum states whose metric is greater than T[y] among Y quantum states approach 1 with complexity $O(\sqrt{Y})$. Therefore, the complexity of a ML decoding process based on quantum computing according to some embodiments of the present disclosure is $O(\sqrt{2^N})$, which is about half of that of a classic ML decoding process.

Figure 15:
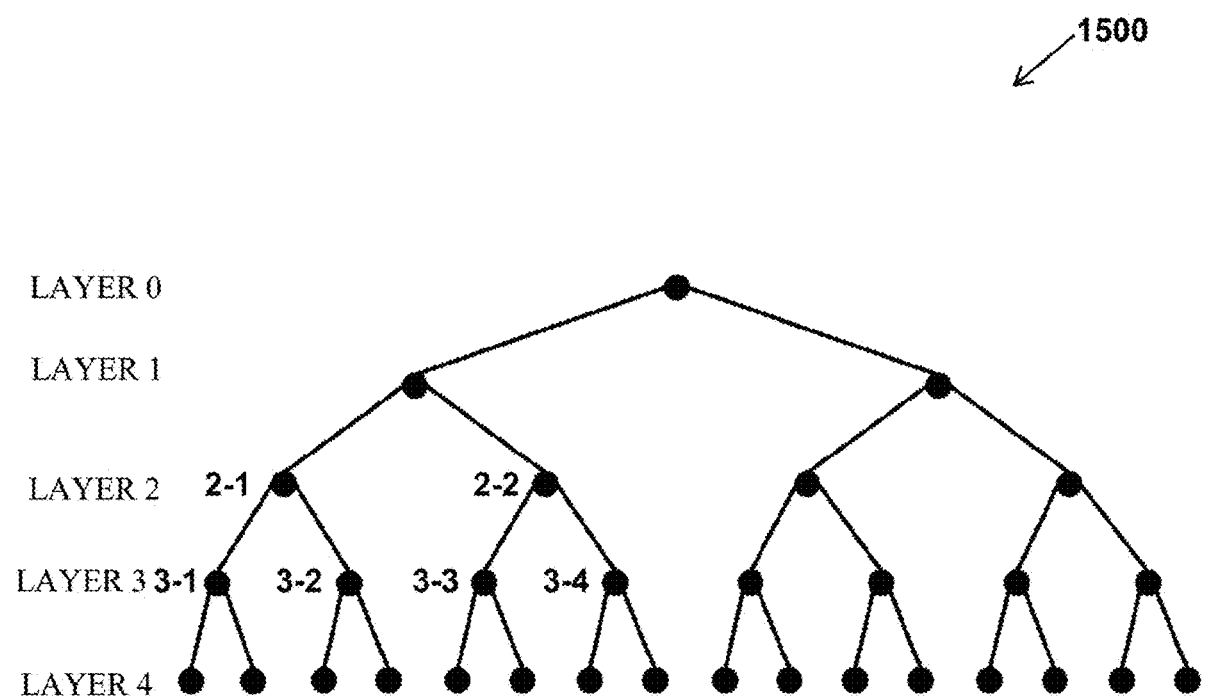
FIG. 15 is a schematic diagram illustrating a decoding tree of a SCL decoding process according to some embodiments of the present disclosure.

A SCL decoding process implements decoding by constructing one decoding tree and searching L decoding paths during layer-by-layer downward search. FIG. 15 is a schematic diagram illustrating a decoding tree 1500 of a SCL decoding process according to some embodiments of the present disclosure. For the decoding tree 1500, its code length is N=4. Each node in the decoding tree 1500 may represent a decoding path from the root node to this node. Therefore, each node in the decoding tree 1500 may be assigned a metric that represents the metric of the decoding path represented by the node.

As illustrated in FIG. 15, assuming that current decoding paths are decoding paths represented by the nodes 2-1 and 2-2 in layer 2, then in the next search, consider decoding paths represented by nodes 3-1, 3-2, 3-3, and 3-4 in layer 3 (they are the decoding paths represented by the child nodes of nodes 2-1 and 2-2 in layer 2 and are referred to herein as sub-decoding paths of the current decoding paths). The SCL decoding method looks for L decoding paths with the largest metric from decoding paths represented by nodes 3-1, 3-2, 3-3, and 3-4, and searches further down on the basis of the L decoding paths found.

Figure 16:
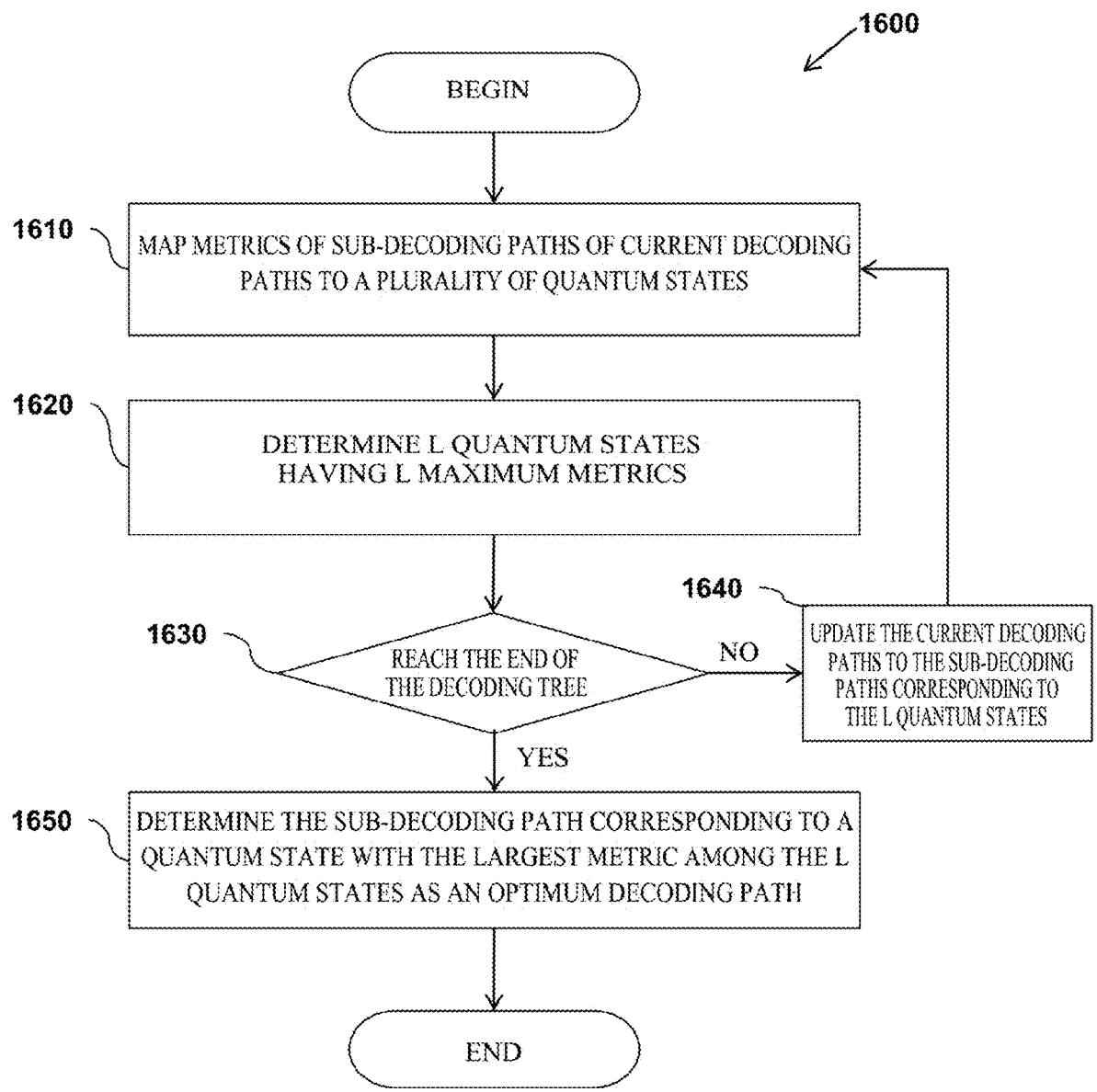
FIG. 16 is a flowchart illustrating an SCL decoding process based on quantum computing according to some embodiments of the present disclosure.

FIG. 16 is a flowchart illustrating a SCL decoding process 1600 based on quantum computing according to some embodiments of the present disclosure.

At step 1610, metrics of sub-decoding paths of current decoding paths are mapped to a plurality of quantum states. In some embodiments, a SCL decoding process based on quantum computing searches f (equal to or greater than 1) layer downward at a time. Assuming that current decoding path is in the F-th layer, the sub-decoding path in step 1610 is the sub-decoding path of the current decoding path in the F+f-th layer.

In step 1620, L quantum states having L maximum metrics are determined. In step 1630, it is determined whether the sub-decoding path of the current decoding path has reached the end of the decoding tree. If the end of the decoding tree is not reached, the current decoding paths are updated to the sub-decoding paths corresponding to the L quantum states determined in step 1620, and returned to step 1610. If the end of the decoding tree has been reached, a sub-decoding path corresponding to a quantum state with the largest metric among the L quantum states determined in step 1620 is determined as an optimum decoding path.

Figure 17:
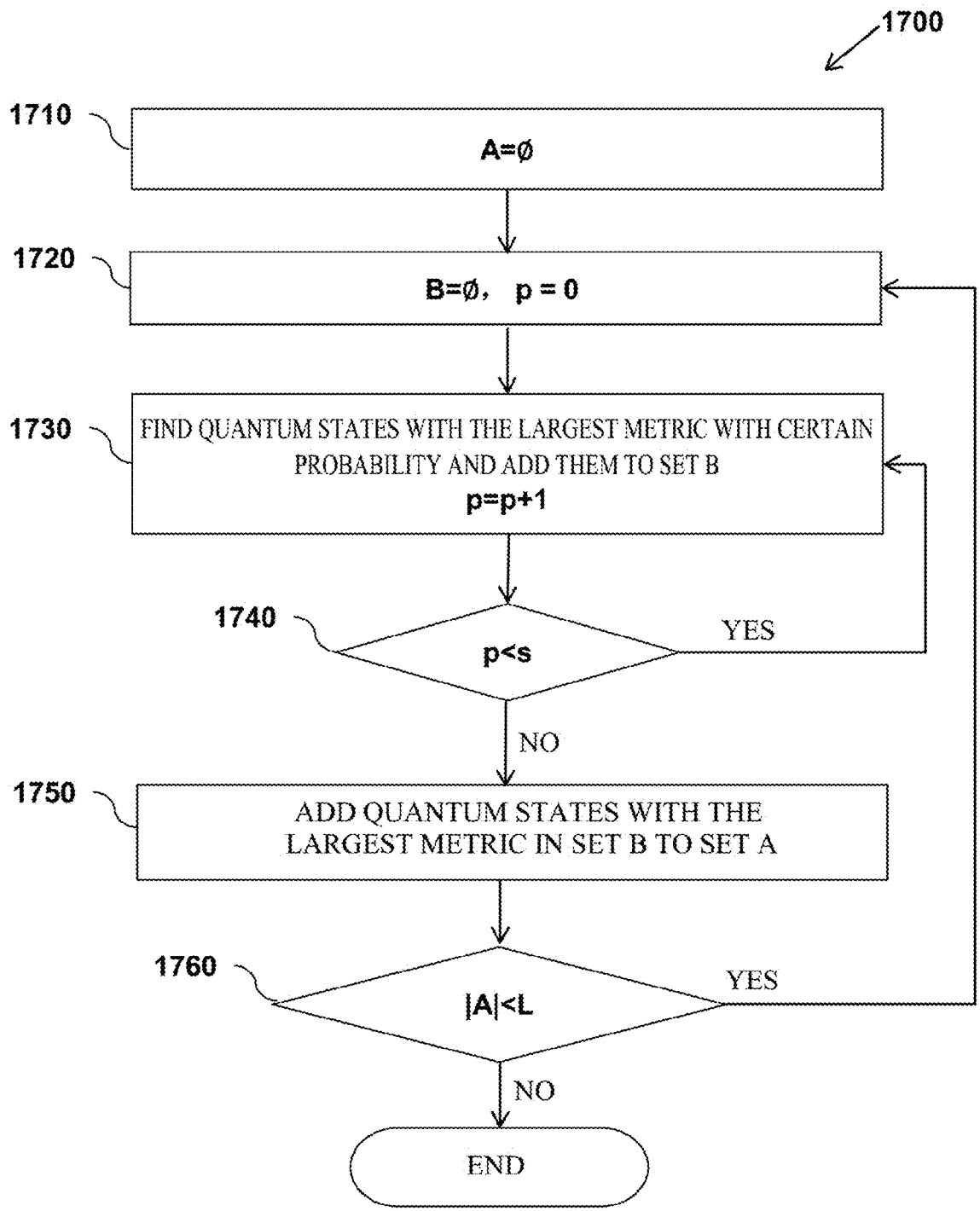
FIG. 17 is a flowchart illustrating a process of determining L quantum states having L maximum metrics according to some embodiments of the present disclosure.

FIG. 17 is a flowchart illustrating a process 1700 of determining L quantum states having L maximum metrics according to some embodiments of the present disclosure. Process 1700 can be used to implement step 1620 in process 1600.

At step 1710, a set A is initialized to an empty set, where set A is used later to store the L quantum states found with L maximum metrics. In step 1720, a set B is made to be an empty set, wherein set B is used later to store the quantum states with the largest metric among Y quantum states searching with a probability $P_0$ (not less than 0.5), wherein the value of Y is the number of sub-decoding paths of the current decoding path.

At step 1730, quantum states with the largest metric is found with probability $P_0$ and added to set B. In some embodiments, step 1730 is implemented by process 1300. In this case, the Y quantum states of the quantum register have metrics of Y sub-decoding paths of the SCL decoding process. In some embodiments of the present disclosure, when applying the Grover algorithm in a SCL decoding process based on quantum computing, the quantum Oracle is made to have the following form:

$$f_{T[y]}(T[x]) = \begin{cases} 1, & T[x] > T[y] \text{ and } x \notin A \\ 0, & T[x] \leq T[y] \text{ or } x \in A \end{cases},$$

wherein x is a quantum state.

At step 1740, it is determined whether step 1730 has been executed s times. If step 1730 has not been executed s times, then return to step 1730. If step 1730 has been executed s times, then proceed to step 1750. In step 1750, quantum states with the largest metric in set B is added to set A. In step 1760, it is determined whether the number of elements in A reaches L. If the number of elements in A is less than L, return to step 1720. If the number of elements in A reaches L, the process 1700 ends.

The complexity of a SCL decoding process based on quantum computing according to an embodiment of the present disclosure is $O(\sqrt{L} \cdot N \log N)$, which is about half of that of a classic SCL decoding process.

Code Length Threshold

The complexity of a ML decoding process based on quantum computing and a SCL decoding process based on quantum computing according to some embodiments of the present disclosure is lower than that of a classic ML decoding process and a classic SCL decoding processing. Therefore, in the case that the complexity is limited, the code length that can be handled by the ML decoding process based on quantum computing and the SCL decoding process based on quantum computing is longer. The code length that a ML decoding process based on quantum computing and a SCL decoding process based on quantum computing according to some embodiments of the present disclosure can process is twice that of a classic ML decoding process and a classic SCL decoding process, respectively.

According to some embodiments of the present disclosure, in a case that the complexity of a classic ML decoding process and/or a ML decoding process based on quantum computing is not so high, the classic ML decoding process and/or the ML decoding process based on quantum computing is selected. In this way, the bit error rate of the decoding result can be low without causing excessive calculation complexity.

Figure 18A:
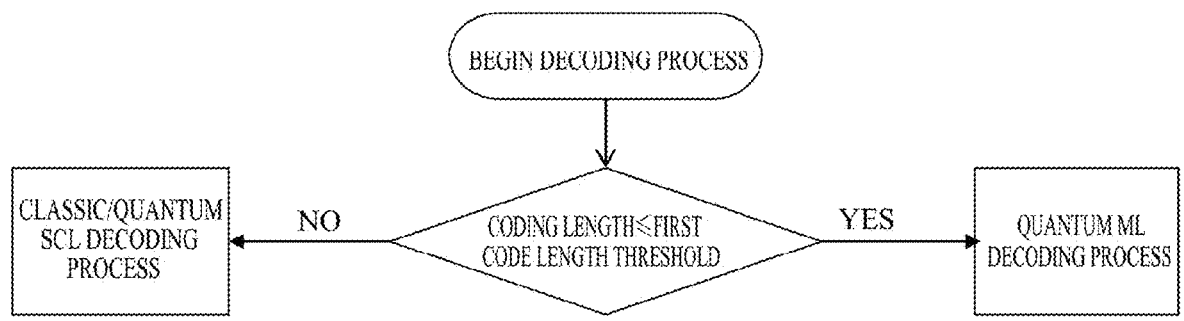
FIGS. 18A and 18B are flowcharts illustrating selection of a decoding process according to some embodiments of the present disclosure.
Figure 18B:
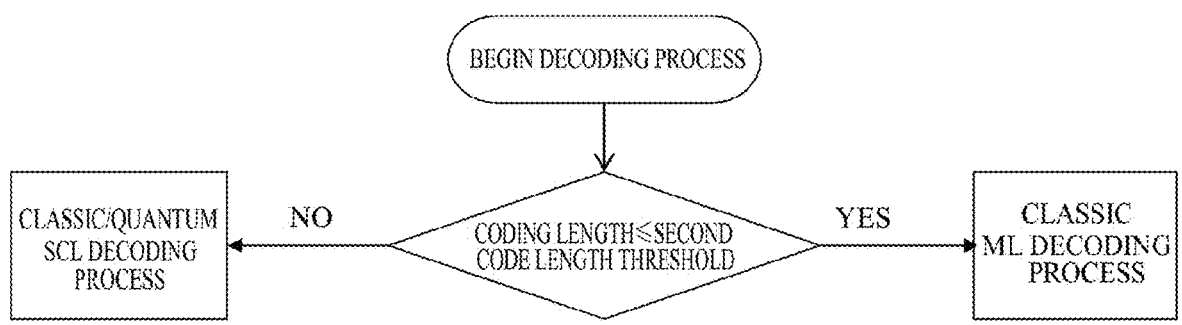

FIGS. 18A and 18B are flowcharts illustrating selection of a decoding process according to some embodiments of the present disclosure.

For a communication apparatus having a capability of decoding process based on quantum computing, a ML decoding process based on quantum computing is selected in a case where the coding length is shorter than or equal to a first code length threshold. A SCL decoding process based on quantum computing or a classic SCL decoding process is selected in a case where the coding length is greater than the first code length threshold.

For a communication apparatus that does not have a capability of decoding process based on quantum computing, a classic ML decoding process is selected in a case where the coding length is shorter than or equal to a second code length threshold. A SCL decoding process based on quantum computing or a classic SCL decoding process is selected in a case where the coding length is greater than the second code length threshold.

According to some embodiments of the present disclosure, the first code length threshold is selected to be twice the second code length threshold, because under the same complexity, the code length that a ML decoding process based on quantum computing can process is twice that of a classic ML decoding process. In some embodiments of the present disclosure, the first code length threshold is selected as 128, and the second code length threshold is selected as 64. The inventor of the present disclosure found that when the code length is shorter than or equal to 128, the complexity of the ML decoding process based on quantum computing can be accepted by a general device. The inventor of the present disclosure also found that when the code length is shorter than or equal to 64, the complexity based on a classic ML decoding process can be accepted by a general device. Note that the specific values of the first code length threshold and the second code length threshold are not limited to 128 and 64, but can be adjusted according to the computing power of a specific device.

According to some embodiments of the present disclosure, different codeword types are defined according to code length. For example, a code word whose code length is greater than the code length threshold is defined as a long code, and a code word whose code length is shorter than or equal to the code length threshold is defined as a short code. According to some embodiments of the present disclosure, after determining the codeword type, one communication apparatus may notify other communication apparatus with which it communicate of the determined codeword type.

According to some embodiments of the present disclosure, for a communication apparatus having a capability of decoding process based on quantum computing, the codeword type is divided using the first code length threshold. According to some embodiments of the present disclosure, for a communication apparatus that does not have a capability of decoding process based on quantum computing, the codeword type is divided using the second code length threshold.

<Simulation Result>

Figure 19:
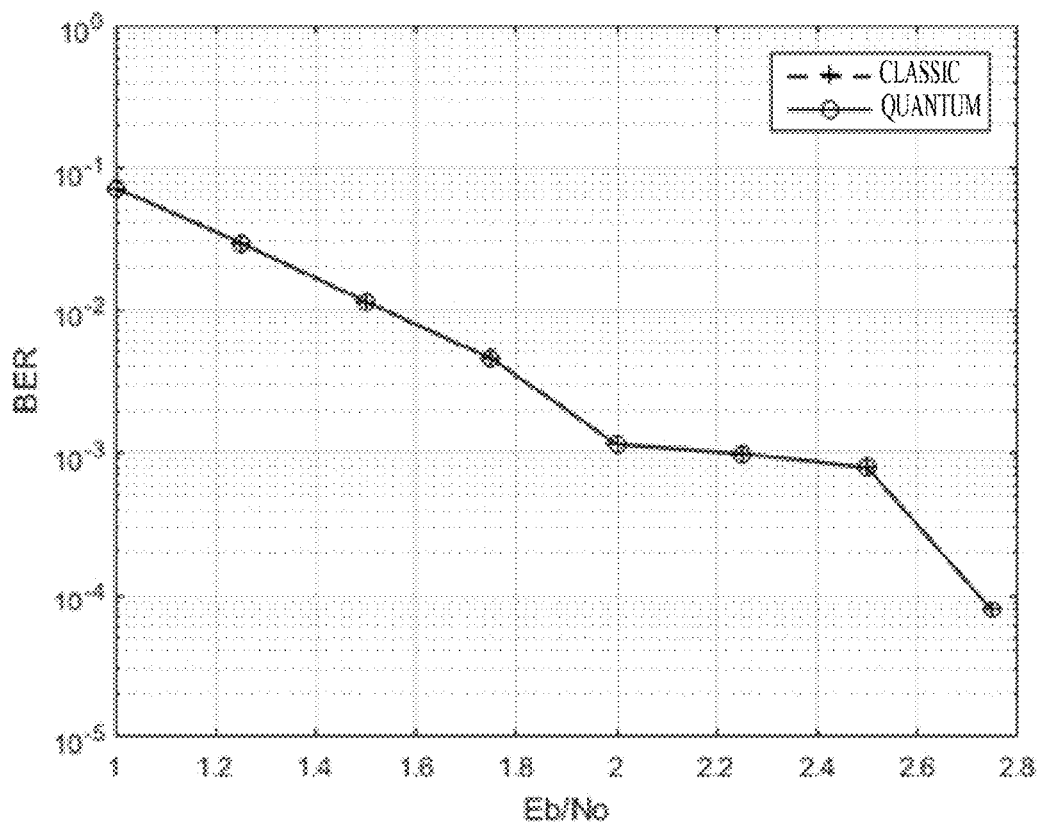
FIG. 19 is a graph showing the bit error rate (BER) of a ML decoding process based on quantum and a classic ML decoding process under different signal-to-noise ratios Eb/No conditions, according to some implementations of the present disclosure.

FIG. 19 is a graph showing the bit error rate (BER) of a ML decoding process based on quantum and a classic ML decoding process under different signal-to-noise ratios Eb/No conditions, according to some implementations of the present disclosure. In this simulation, the code length of polar code is selected as 64, which includes 22 message bits and 42 frozen bits. Adapting a BPSK modulation method, the signal-to-noise ratio of a channel changed from 1 dB to 2.75 dB with a change step of 0.25 dB. In each cycle, 1000 polar codes were sent and the bit error rate was counted.

As it can be seen from FIG. 19, the bit error rate curves of a ML decoding process based on quantum computing and a classic ML decoding process according to some embodiments of the present disclosure are almost the same. This shows that the ML decoding process based on quantum according to some embodiments of the present disclosure can substantially achieve the decoding accuracy of a classic ML decoding process.

Figure 20:
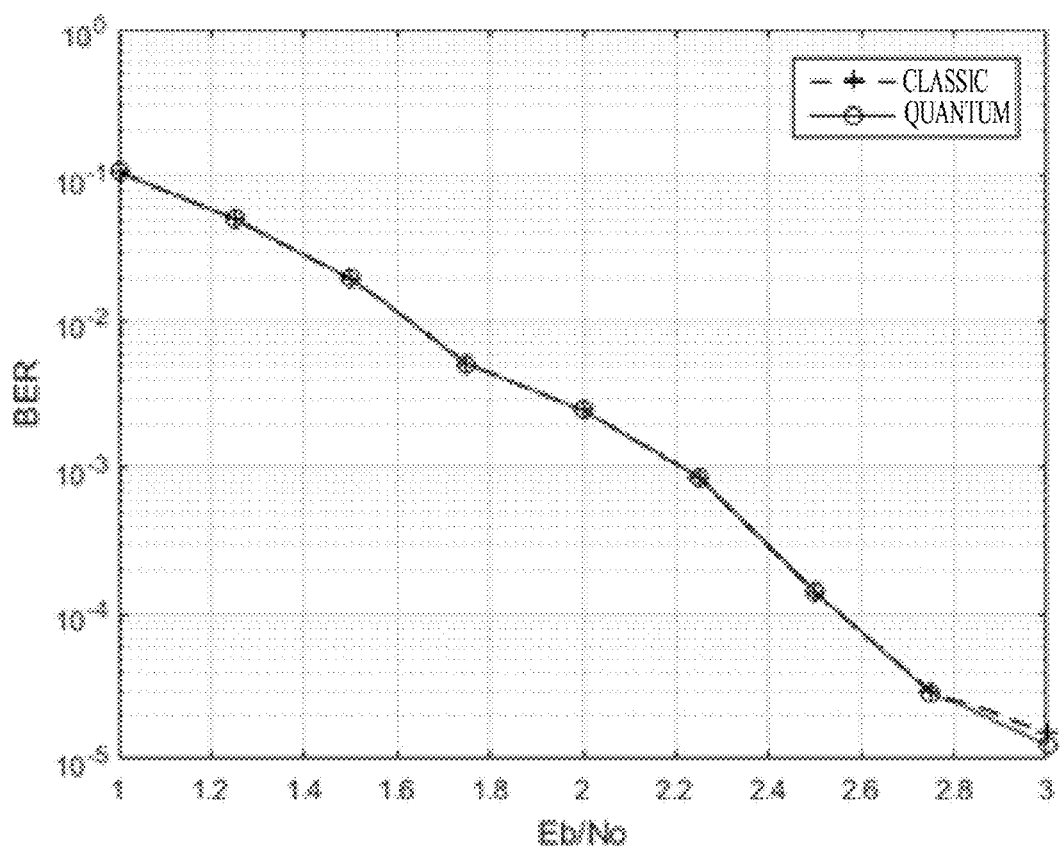
FIG. 20 is a graph showing the bit error rate (BER) of a SCL decoding process based on quantum computing and a classic SCL decoding process under different signal-to-noise ratio Eb/No conditions, according to some embodiments of the present disclosure.

FIG. 20 is a graph showing the bit error rate (BER) of a SCL decoding process based on quantum computing and a classic SCL decoding process under different signal-to-noise ratio Eb/No conditions, according to some embodiments of the present disclosure. In this simulation, adapting a BPSK modulation method, the signal-to-noise ratio of a channel changed from 1 dB to 3 dB with a change step of 0.25 dB. The code length of polar code is selected as 1024. Among the 1024 bits, 512 are message bits and 512 bits are frozen bits. In each cycle, 1000 polar codes were sent and their bit error rates were counted. For the SCL decoding process based on quantum computing, three layers were searched downward at a time and 8 paths with the largest metrics were kept.

As can be seen from FIG. 20, compared with the classic SCL decoding process, the SCL decoding process based on quantum computing according to some embodiments of the present disclosure has only a small error within allowable range of error, this part of error was due to the uncertainty in the maximum search process of the quantum search algorithm. This shows that the SCL decoding process based on quantum computing according to some embodiments of the present disclosure can substantially achieve the decoding accuracy of a classic SCL decoding process.

Figure 21:
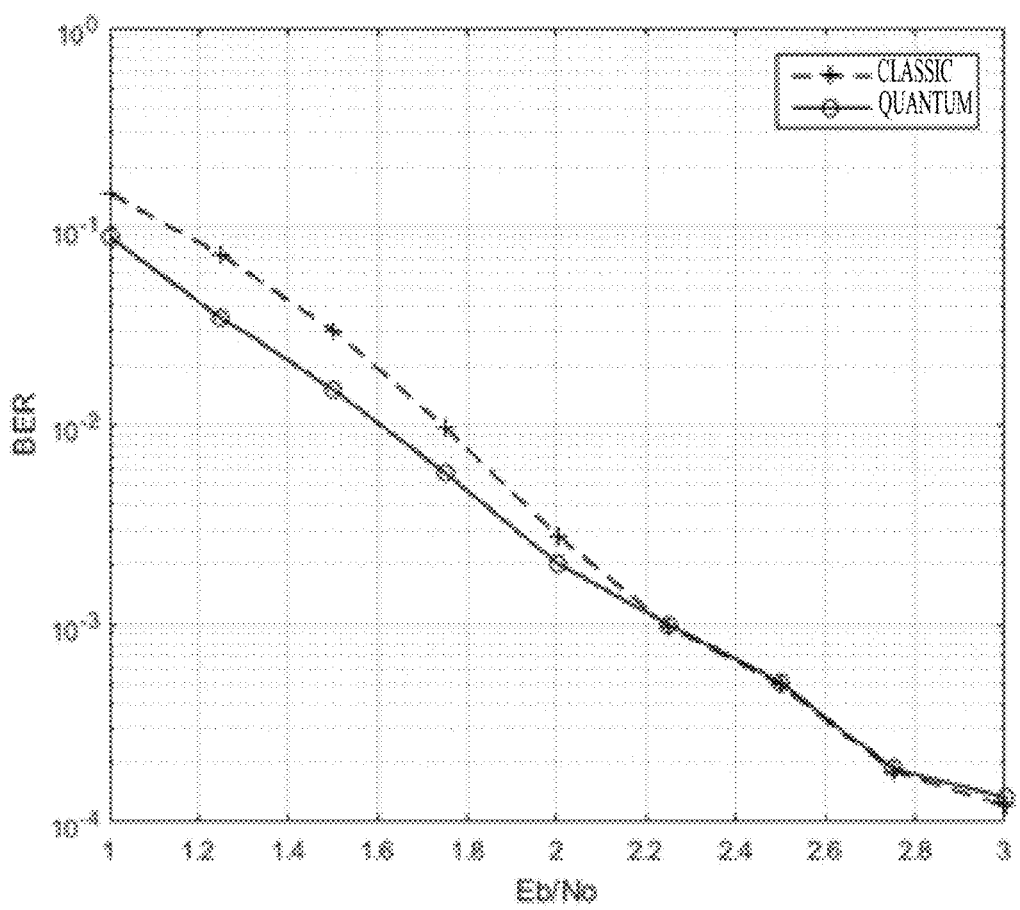
FIG. 21 is a graph showing the bit error rates (BER) of a SCL decoding process based on quantum computing and a classic SCL decoding process when defining the decoding complexity, according to some embodiments of the present disclosure.

FIG. 21 is a graph showing the bit error rates (BER) of a SCL decoding process based on quantum computing and a classic SCL decoding process when defining the decoding complexity, according to some embodiments of the present disclosure. As it can be seen from FIG. 21 that when the signal-to-noise ratio is relatively high, the accuracy of a SCL decoding process based on quantum computing according to some embodiments of the present disclosure is similar to that of a classic SCL decoding process; when the signal-to-noise ratio is low, the SCL decoding process based on quantum computing according to some embodiments of the present disclosure has a even lower error rate. —Application Examples Terminal device can be implemented as a mobile terminal (such as a smartphone, a tablet personal computer (PCs), a notebook PC, a portable game terminal, a portable/encrypted dongle-type mobile router, and a digital camera device), an in-vehicle terminal (such as a car navigation device), a terminal that performs Machine-to-Machine (M2M) communication (also referred to as a machine type communication (MTC) terminal), a sensor node in Ad hoc networks, a smart meter, a smart appliance, and a Geolocation Capability Object (GCO) in a cognitive radio system, a Citizens Broadband Radio Service Device (CBSD). In addition, the terminal device may be implemented as a wireless communication module (such as an integrated circuit module including a single wafer) mounted on each of the above terminal devices.

Non-terminal device can be implemented as a base station (BS), a small base station, a Node B, an e-NodeB, a g-NodeB, a relay, etc. in a cellular communication system, a terminal device in a machine-type communication system, a Coexistence Managers (CM) in a cognitive radio system, a SAS, etc. Non-terminal device can be implemented as any type of evolved Node B (eNB), such as a macro eNB (associated with a macro cell) and a small eNB (associated with a small cell). The small eNB can be an eNB covering a cell smaller than a macro cell, such as a pico eNB, a micro eNB, and a home (femto) eNB. Non-terminal device can be implemented as any other type of base station, such as network nodes in next-generation networks, like gNB, NodeB, and base transceiver station (BTS). Non-terminal device can be implemented as a main body (also referred to as a base station device) configured to control wireless communication; and one or more remote wireless heads (RRHs) disposed in a different place from the main body. In addition, various types of terminal devices can operate as non-terminal devices by temporarily or semi-permanently performing functions of non-terminal devices.

Application Examples Regarding Base Stations

First Application Example

Figure 22:
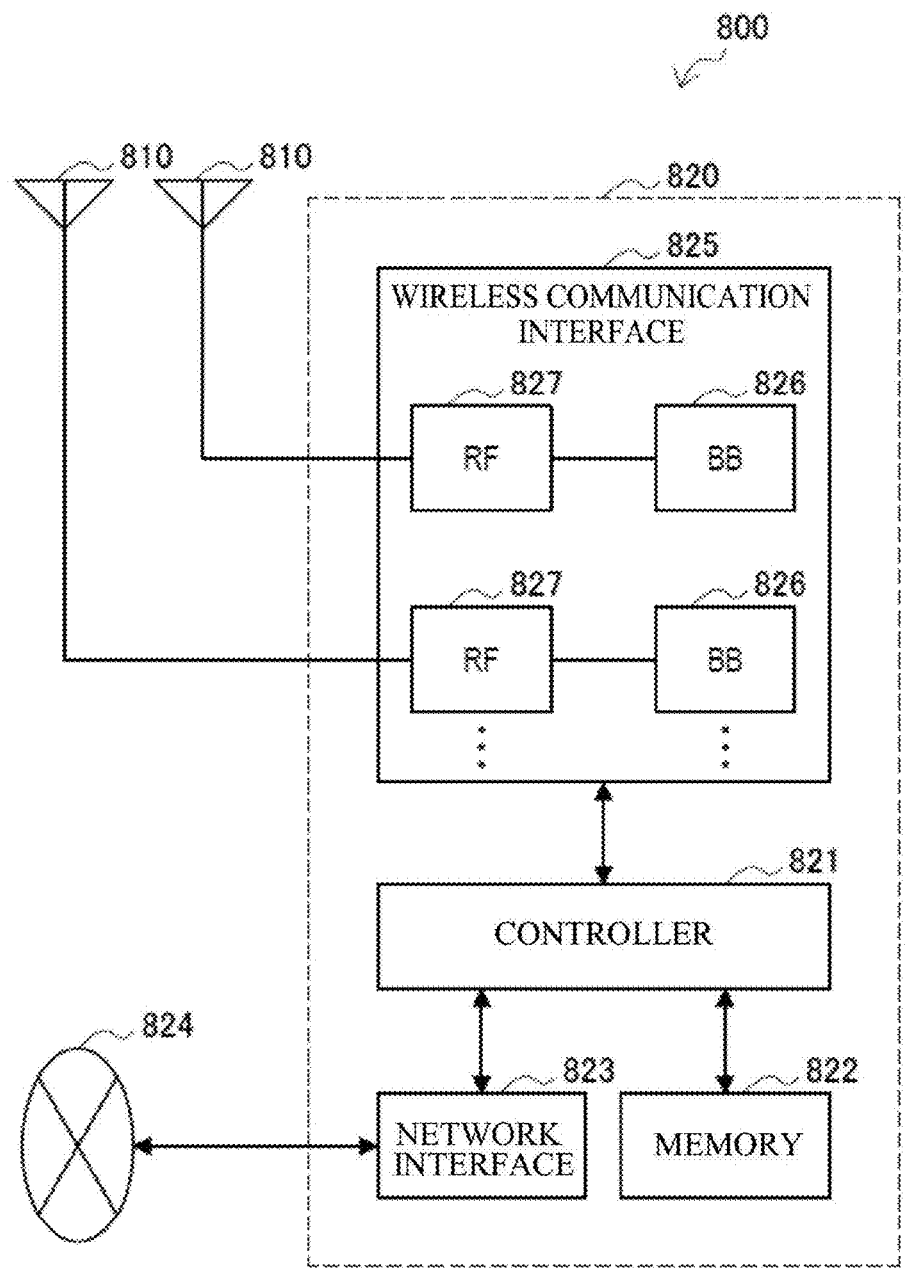
FIG. 22 is a block diagram illustrating a first example of a schematic configuration of an eNB.

FIG. 22 is a block diagram illustrating a first example of a schematic configuration of an eNB to which the technology of the present disclosure may be applied. An eNB 800 includes one or more antennas 810 and a base station device 820. The base station device 820 and each antenna 810 may be connected to each other via an RF cable.

Each of the antennas 810 includes a single or multiple antenna units (such as multiple antenna elements included in a multiple input multiple output (MIMO) antenna), and is used for the base station device 820 to transmit and receive wireless signals. As illustrated in FIG. 22, the eNB 800 may include multiple antennas 810. For example, the multiple antennas 810 can be compatible with multiple frequency bands used by the eNB 800. Although FIG. 22 illustrates an example in which the eNB 800 includes multiple antennas 810, the eNB 800 may also include a single antenna 810.

The base station device 820 includes a controller 821, a memory 822, a network interface 823, and a wireless communication interface 825.

The controller 821 may be, for example, a CPU or a DSP, and operates various functions of higher layers of the base station device 820. For example, the controller 821 generates a data packet from data in signals processed by the wireless communication interface 825, and transfers the generated packet via the network interface 823. The controller 821 may bundle data from multiple base band processors to generate the bundled packet and transfer the generated bundled packet. The controller 821 may have logic functions of performing control such as radio resource control, radio bearer control, mobility management, admission control, and scheduling. This control may be performed in conjunction with an eNB or a core network node in the vicinity. The memory 822 includes RAM and ROM, and stores a program that is executed by the controller 821, and various types of control data (such as a terminal list, transmission power data, and scheduling data).

The network interface 823 is a communication interface for connecting the base station device 820 to a core network 824. The controller 821 may communicate with a core network node or another eNB via the network interface 823. In that case, the eNB 800, and the core network node or the other eNB may be connected to each other through a logical interface (such as an S1 interface and an X2 interface). The network interface 823 may also be a wired communication interface or a wireless communication interface for radio backhaul. If the network interface 823 is a wireless communication interface, the network interface 823 may use a higher frequency band for wireless communication than a frequency band used by the wireless communication interface 825.

The wireless communication interface 825 supports any cellular communication scheme such as Long Term Evolution (LTE) and LTE-Advanced, and provides radio connection to terminal positioned in a cell of the eNB 800 via the antenna 810. The wireless communication interface 825 may typically include, for example, a baseband (BB) processor 826 and an RF circuit 827. The BB processor 826 may perform, for example, encoding/decoding, modulation/ demodulation, and multiplexing/demultiplexing, and performs various types of signal processing of layers (such as L1, medium access control (MAC), radio link control (RLC), and packet data convergence protocol (PDCP)). The BB processor 826 may have a part or all of the above-described logical functions Instead of the controller 821. The BB processor 826 may be a memory that stores a communication control program, or a module that includes a processor and a related circuitry configured to execute the program. Updating the program may allow the functions of the BB processor 826 to be changed. The module may be a card or a blade that is inserted into a slot of the base station device 820. Alternatively, the module may also be a chip that is mounted on the card or the blade. Meanwhile, the RF circuit 827 may include, for example, a mixer, a filter, and an amplifier, and transmits and receives wireless signals via the antenna 810.

As illustrated in FIG. 22, the wireless communication interface 825 may include the multiple BB processors 826. For example, the multiple BB processors 826 may be compatible with multiple frequency bands used by the eNB 800. As illustrated in FIG. 22, the wireless communication interface 825 may include the multiple RF circuits 827. For example, the multiple RF circuits 827 may be compatible with multiple antenna elements. Although FIG. 22 illustrates the example in which the wireless communication interface 825 includes the multiple BB processors 826 and the multiple RF circuits 827, the wireless communication interface 825 may also include a single BB processor 826 or a single RF circuit 827.

(Second Application Example)

Figure 23:
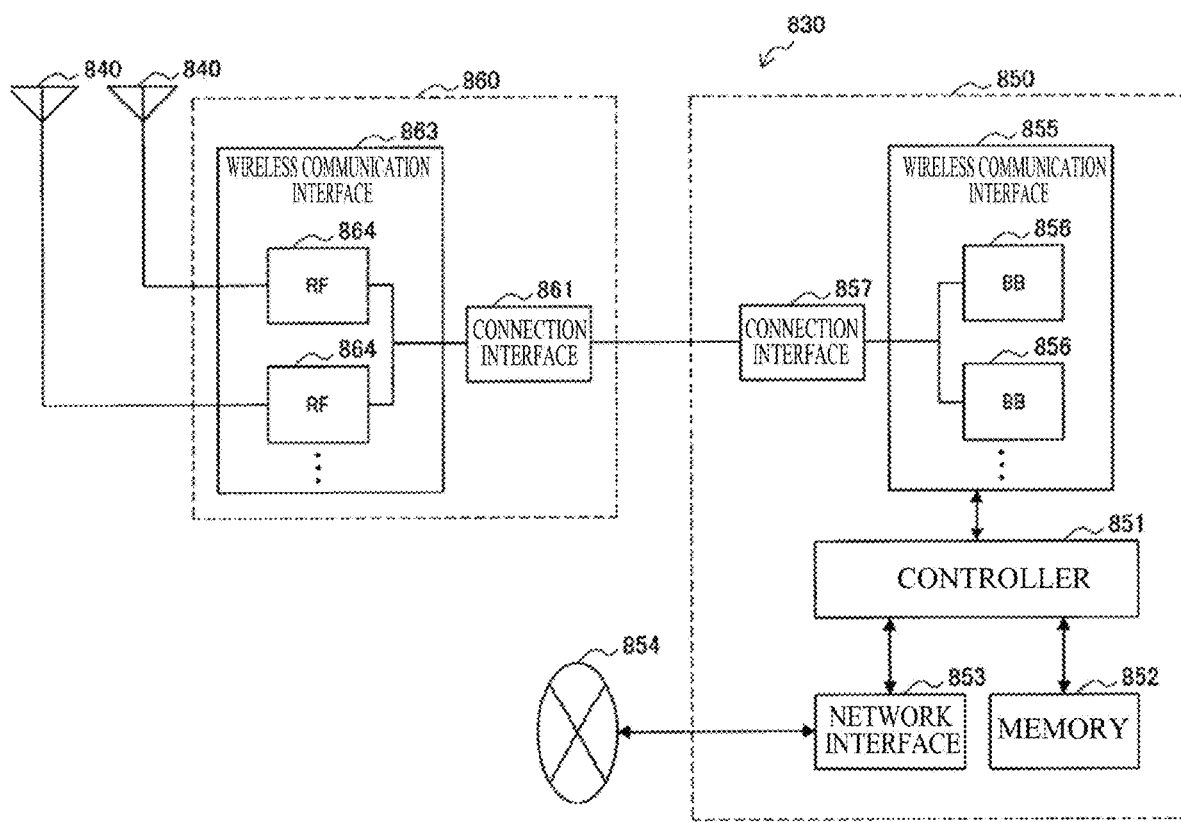
FIG. 23 is a block diagram illustrating a second example of a schematic configuration of an eNB.

FIG. 23 is a block diagram illustrating a second example of a schematic configuration of an eNB to which the technology of the present disclosure may be applied. An eNB 830 includes one or more antennas 840, a base station device 850, and an RRH 860. The RRH 860 and each antenna 840 may be connected to each other via an RF cable. The base station device 850 and the RRH 860 may be connected to each other via a high speed line such as an optic fiber cable.

Each of the antennas 840 includes a single or multiple antenna elements (such as multiple antenna elements included in a MIMO antenna) and is used for the RRH 860 to transmit and receive wireless signals. As illustrated in FIG. 23, the eNB 830 may include the multiple antennas 840. For example, the multiple antennas 840 may be compatible with multiple frequency bands used by the eNB 830. Although FIG. 23 illustrates an example in which the eNB 830 includes multiple antennas 840, the eNB 830 may also include a single antenna 840.

The base station device 850 includes a controller 851, a memory 852, a network interface 853, a wireless communication interface 855, and a connection interface 857. The controller 851, the memory 852, and the network interface 853 are the same as the controller 821, the memory 822, and the network interface 823 described with reference to FIG. 22.

The wireless communication interface 855 supports any cellular communication scheme (such as LTE and LTE-Advanced) and provides wireless communication to a terminal positioned in a sector corresponding to the RRH 860 via the RRH 860 and the antenna 840. The wireless communication interface 855 may typically include, for example, a BB processor 856. The BB processor 856 is the same as the BB processor 826 described with reference to FIG. 22, except that the BB processor 856 is connected to the RF circuit 864 of the RRH 860 via the connection interface 857. The wireless communication interface 855 may include the multiple BB processors 856, as illustrated in FIG. 23. For example, the multiple BB processors 856 may be compatible with multiple frequency bands used by the eNB 830. Although FIG. 23 illustrates the example in which the wireless communication interface 855 includes the multiple BB processors 856, the wireless communication interface 855 may also include a single BB processor 856.

The connection interface 857 is an interface for connecting the base station device 850 (wireless communication interface 855) to the RRH 860. The connection interface 857 may also be a communication module for communicating in the above-described high speed line that connects the base station device 850 (wireless communication interface 855) to the RRH 860.

The RRH 860 includes a connection interface 861 and a wireless communication interface 863.

The connection interface 861 is an interface for connecting the RRH 860 (wireless communication interface 863) to the base station device 850. The connection interface 861 may also be a communication module for communication in the above-described high speed line.

The wireless communication interface 863 transmits and receives wireless signals via the antenna 840. Wireless communication interface 863 may typically include, for example, the RF circuit 864. The RF circuit 864 may include, for example, a mixer, a filter, and an amplifier, and transmits and receives wireless signals via the antenna 840. The wireless communication interface 863 may include multiple RF circuits 864, as illustrated in FIG. 23. For example, the multiple RF circuits 864 may support multiple antenna elements. Although FIG. 23 illustrates the example in which the wireless communication interface 863 includes the multiple RF circuits 864, the wireless communication interface 863 may also include a single RF circuit 864.

Application Examples Regarding Terminal Devices

First Application Example

Figure 24:
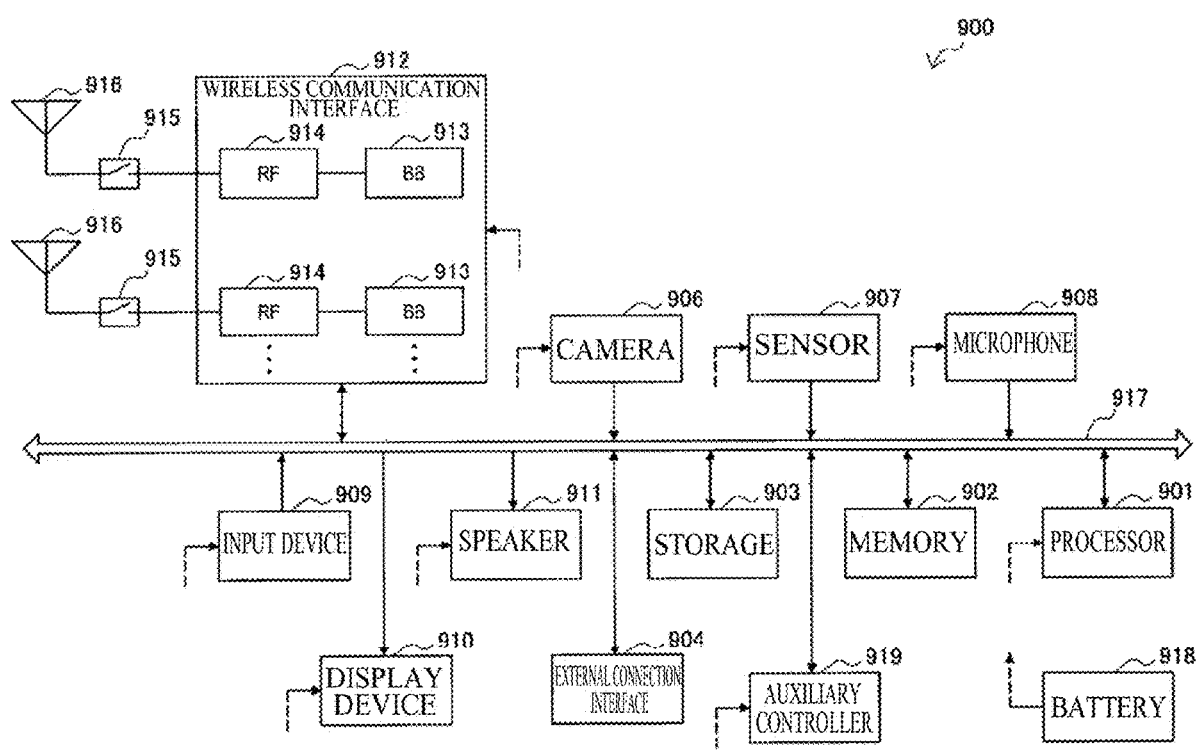
FIG. 24 is a block diagram illustrating an example of a schematic configuration of a smartphone.

FIG. 24 is a block diagram illustrating an example of a schematic configuration of a smartphone 900 to which the technology of the present disclosure may be applied. The smartphone 900 includes a processor 901, a memory 902, a storage 903, an external connection interface 904, a camera 906, a sensor 907, a microphone 908, an input device 909, a display device 910, a speaker 911, a wireless communication interface 912, one or more antenna switches 915, one or more antennas 916, a bus 917, a battery 918, and an auxiliary controller 919.

The processor 901 may be, for example, a CPU or a system on a chip (SoC), and controls functions of an application layer and another layer of the smart phone 900. The memory 902 includes RAM and ROM, and stores data and a program that is executed by the processor 901. The storage 903 may include a storage medium such as a semiconductor memory and a hard disk. The external connection interface 904 is an interface for connecting an external device such as a memory card and a universal serial bus (USB) device to the smartphone 900.

The camera 906 includes an image sensor such as a charge coupled device (CCD) and a complementary metal oxide semiconductor (CMOS), and generates a captured image. The sensor 907 may include a group of sensors such as a measurement sensor, a gyro sensor, a geomagnetic sensor, and an acceleration sensor. The microphone 908 converts sounds that are input to the smartphone 900 to audio signals.

The input device 909 includes, for example, a touch sensor configured to detect touch onto a screen of the display device 910, a keypad, a keyboard, a button, or a switch, and receives an operation or an information input from a user. The display device 910 includes a screen such as a liquid crystal display (LCD) and an organic light-emitting diode (OLED) display, and displays an output image of the smartphone 900. The speaker 911 converts audio signals that are output from the smartphone 900 to sounds.

The wireless communication interface 912 supports any cellular communication scheme (such as LTE and LTE-Advanced) and performs wireless communication. The wireless communication interface 912 may typically include, for example, a BB processor 913 and an RF circuit 914. The BB processor 913 may perform, for example, encoding/decoding, modulation/demodulation, and multiplexing/demultiplexing, and performs various types of signal processing for wireless communication. Meanwhile, the RF circuit 914 may include, for example, a mixer, a filter, and an amplifier, and transmits and receives wireless signals via the antenna 916. The wireless communication interface 912 may be one chip module that has the BB processor 913 and the RF circuit 914 integrated thereon. The wireless communication interface 912 may include the multiple BB processors 913 and the multiple RF circuits 914, as illustrated in FIG. 24. Although FIG. 24 illustrates the example in which the wireless communication interface 912 includes the multiple BB processors 913 and the multiple RF circuits 914, the wireless communication interface 912 may also include a single BB processor 913 or a single RF circuit 914.

Furthermore, in addition to a cellular communication scheme, the wireless communication interface 912 may support another type of wireless communication scheme such as a short-distance wireless communication scheme, a near field communication scheme, and a wireless local area network (LAN) scheme. In that case, the wireless communication interface 912 may include the BB processor 913 and the RF circuit 914 for each wireless communication scheme.

Each of the antenna switches 915 switches connection destinations of the antennas 916 among multiple circuits (such as circuits for different wireless communication schemes) included in the wireless communication interface 912.

Each of the antennas 916 includes a single or multiple antenna elements (such as multiple antenna elements included in an MIMO antenna), and is used for the wireless communication interface 912 to transmit and receive wireless signals. The smartphone 900 may include multiple antennas 916, as illustrated in FIG. 24.

Although FIG. 24 illustrates the example in which the smartphone 900 includes the multiple antennas 916, the smartphone 900 may also include a single antenna 916.

Furthermore, the smart phone 900 may include the antenna 916 for each wireless communication scheme. In that case, the antenna switches 915 may be omitted from the configuration of the smartphone 900.

The bus 917 connects the processor 901, the memory 902, the storage 903, the external connection interface 904, the camera 906, the sensor 907, the microphone 908, the input device 909, the display device 910, the speaker 911, the wireless communication interface 912, and the auxiliary controller 919 to each other. The battery 918 supplies power to blocks of the smart phone 900 illustrated in FIG. 24 via feeder lines, which are partially shown as dashed lines in the figure. The auxiliary controller 919 operates a minimum necessary function of the smartphone 900, for example, in a sleep mode.

(Second Application Example)

Figure 25:
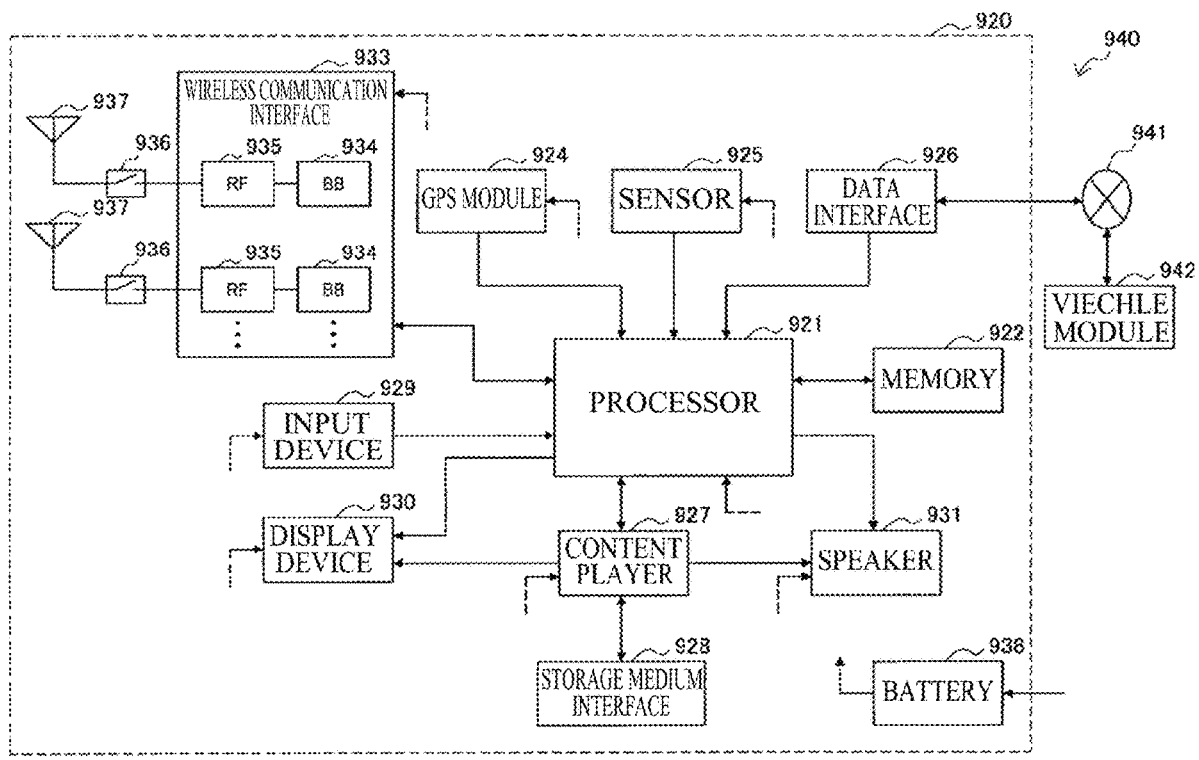
FIG. 25 is a block diagram illustrating an example of a schematic configuration of a car navigation device.

FIG. 25 is a block diagram illustrating an example of a schematic configuration of a car navigation device 920 to which the technology of the present disclosure may be applied. The car navigation device 920 includes a processor 921, a memory 922, a global positioning system (GPS) module 924, a sensor 925, a data interface 926, a content player 927, a storage medium interface 928, an input device 929, a display device 930, a speaker 931, and a wireless communication interface 933, one or more antenna switches 936, one or more antennas 937, and a battery 938.

The processor 921 may be, for example, a CPU or a SoC, and controls a navigation function and another function of the car navigation device 920. The memory 922 includes RAM and ROM, and stores data and a program that is executed by the processor 921.

The GPS module 924 uses GPS signals received from a GPS satellite to measure a position (such as latitude, longitude, and altitude) of the car navigation device 920. The sensor 925 may include a group of sensors such as a gyro sensor, a geomagnetic sensor, and a barometric sensor. The data interface 926 is connected to, for example, an in-vehicle network 941 via a terminal that is not shown, and acquires data (such as vehicle speed data) generated by the vehicle.

The content player 927 reproduces content stored in a storage medium (such as a CD and a DVD) that is inserted into the storage medium interface 928. The input device 929 includes, for example, a touch sensor configured to detect touch onto a screen of the display device 930, a button, or a switch, and receives an operation or an information input from a user. The display device 930 includes a screen such as a LCD or an OLED display, and displays an image of the navigation function or content that is reproduced. The speaker 931 outputs sounds of the navigation function or the content that is reproduced.

The wireless communication interface 933 supports any cellular communication scheme (such as LTE and LTE-Advanced) and performs wireless communication. The wireless communication interface 933 may typically include, for example, a BB processor 934 and an RF circuit 935. The BB processor 934 may perform, for example, encoding/decoding, modulating/demodulating, and multiplexing/demultiplexing, and performs various types of signal processing for wireless communication. Meanwhile, the RF circuit 935 may include, for example, a mixer, a filter, and an amplifier, and transmits and receives wireless signals via the antenna 937. The wireless communication interface 933 may also be one chip module having the BB processor 934 and the RF circuit 935 integrated thereon. The wireless communication interface 933 may include the multiple BB processors 934 and the multiple RF circuits 935, as illustrated in FIG. 25. Although FIG. 25 illustrates the example in which the wireless communication interface 933 includes the multiple BB processors 934 and the multiple RF circuits 935, the wireless communication interface 933 may also include a single BB processor 934 or a single RF circuit 935.

Furthermore, in addition to a cellular communication scheme, the wireless communication interface 933 may support another type of wireless communication scheme, such as a short-distance wireless communication scheme, a near-field communication scheme, and a wireless LAN scheme. In that case, the wireless communication interface 933 may include the BB processor 934 and the RF circuit 935 for each wireless communication scheme.

Each of the antenna switches 936 switches connection destinations of the antennas 937 among multiple circuits (such as circuits for different wireless communication schemes) included in the wireless communication interface 933.

Each of the antennas 937 includes a single or multiple antenna elements (such as multiple antenna elements included in an MIMO antenna) and is used for the wireless communication interface 933 to transmit and receive wireless signals. The car navigation device 920 may include the multiple antennas 937, as illustrated in FIG. 25. Although FIG. 25 illustrates the example in which the car navigation device 920 includes the multiple antennas 937, the car navigation device 920 may also include a single antenna 937.

Furthermore, the car navigation device 920 may include the antenna 937 for each wireless communication scheme. In that case, the antenna switches 936 may be omitted from the configuration of the car navigation device 920.

The battery 938 supplies power to blocks of the car navigation device 920 illustrated in FIG. 25 via feeders lines that are partially shown as dashed lines in the figure. The battery 938 accumulates power supplied from the vehicle.

The technology of the present disclosure may also be realized as an in-vehicle system (or a vehicle) 940 including one or more blocks of the car navigation device 920, the in-vehicle network 941, and a vehicle module 942. The vehicle module 942 generates vehicle data such as vehicle speed, engine speed, and trouble information, and outputs the generated data to the in-vehicle network 941.

The detailed description set forth above in connection with the accompanying drawings describes examples, and is neither to denote the only examples that can be realized, nor denote the only examples within the scope of the claims. The words "example" and "exemplary", when used in the specification, mean "used as an example, instance or description," and does not mean "preferred" or "more beneficial than other examples." The detailed description includes specific details to provide an understanding of the described technologies. However, these technologies may be practiced without these specific details. In some instances, well known structures and apparatus are shown in the form of block in order to avoid obscuring the concepts of the described examples.

Information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and components described in connection with the present disclosure may be implemented or performed with a general purpose processor, a digital signal processor (DSP), an ASIC, an FPGA or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, and/or state machine. A processor may also be implemented as a combination of computing devices, e.g., a combination of a DSP and a microprocessor, a plurality of microprocessors, one or more microprocessors in conjunction with a DSP core, and/or any other such configuration.

The functions described herein may be implemented in hardware, software executed by a processor, firmware, or any combination thereof. If implemented in software executed by a processor, the functions may be stored on a computer readable medium or transmitted as one or more instructions or code on a computer readable medium. Other examples and implementations are within the scope and spirit of the disclosure and the appended claims. For example, in view of the nature of the software, the functions described above may be performed using software executed by a processor, hardware, firmware, hardwired, or any combination of thereof. Features that implement the functions may also be physically placed at various locations, including being distributed such that portion of the functionality are realized at different physical locations.

Furthermore, the disclosure of components contained within or separate from other components should be considered as exemplary, as various other architectures may potentially be realized to achieve the same functionality, including incorporation of all, a majority part of, and/or some of the elements as one or more single structures or a portion of a separated structure.

Computer readable media includes both computer storage media and communication media that includes any medium that facilitates transfer of a computer program from one place to another. A storage medium may be any available media that may be accessed by a general purpose or special purpose computer. By way of example and not limitation, a computer readable medium may comprise RAM, ROM, EEPROM, flash memory, CD-ROM, DVD or other optical disk storage, disk storage or other magnetic storage device, or any other medium that can be used to carry or store desired program code component in the form of instruction or data structure and that can be accessed by a general purpose or special purpose computer or a general purpose or special purpose processor. Also, any connection is appropriately referred to as a computer-readable medium. For example, if the software is transmitted from a website, server, or other remote source using coaxial cable, optic fiber cable, twisted pair, digital subscriber line (DSL), or wireless technologies such as infrared, radio, and microwave, then the coaxial cable, optical fiber cable, twisted pair, DSL, or wireless technologies such as infrared, radio, and microwave are included in the definition of the medium. Disks and discs as used herein include compact discs (CDs), laser discs, optical discs, digital versatile discs (DVDs), floppy discs, and Blu-ray discs, where the disk typically magnetically replicates data while the disc optically replicates data using a laser. Combinations of the above are also included within the scope of computer readable media.

The foregoing description of the disclosure is provided to enable a person skilled in the art to make or use the disclosure. The various modifications of the present disclosure will be apparent to those skilled in the art, and the general principles defined herein may be applied to other variations without departing from the scope of the present disclosure. Accordingly, the present disclosure is not limited to the examples and designs described herein, rather, it corresponds to the broadest scope consistent with the disclosed principles and novel features.

Some embodiments of the present disclosure may also be configured as follows:

1. An electronic device comprising:
   processing circuitry configured to
   determine a codec capability of at least one of a first communication apparatus and a second communication apparatus;

determine codec information for communication between the first communication apparatus and the second communication apparatus, based on the codec capability;

wherein determining the codec capability comprises determining whether the codec capability comprises a capability of performing a decoding process based on quantum computing.

2. The electronic device according to item 1, wherein the codec capability is a codec capability for a polar code.

3. The electronic device according to item 2, wherein the codec information indicates positions of message bits or frozen bits.

4. The electronic device according to item 1, wherein the codec capability comprises at least one of a maximum encoding length and a maximum decoding length, and the codec information comprises a coding length for the communication between the first communication apparatus and the second communication apparatus selected based on the codec capability, and wherein the coding length is shorter than or equal to the at least one of the maximum encoding length and the maximum decoding length.

5. The electronic device according to item 1, wherein the codec information comprises a code length threshold for selecting a decoding process at at least one of the first communication apparatus and the second communication apparatus.

6. The electronic device according to item 5, wherein the code length threshold is a first code length threshold for selecting a Maximum Likelihood decoding process based on quantum computing in a case where the codec capability comprises the capability of performing the decoding process based on quantum computing, and wherein the Maximum Likelihood decoding process based on quantum computing is selected in a case where the coding length for the communication between the first communication apparatus and the second communication apparatus is shorter than or equal to the first code length threshold.

7. The electronic device according to item 6, wherein the code length threshold is a second code length threshold for selecting a classic Maximum Likelihood decoding process in a case where the codec capability does not comprise the capability of performing the decoding process based on quantum computing, and wherein the classic Maximum Likelihood decoding process is selected in a case where the coding length for the communication between the first communication apparatus and the second communication apparatus is shorter than or equal to the second code length threshold.

8. The electronic device according to item 7, wherein the first code length threshold is twice the second code length threshold.

9. The electronic device according to item 6, wherein the first code length threshold is 128.

10. The electronic device according to item 1, wherein the decoding process based on quantum computing comprises the following steps:

a) mapping a plurality of metrics corresponding to a plurality of possible decoding results to a plurality of quantum states of a set of quantum registers;

b) determining a maximum metric of the plurality of metrics mapped to the plurality of quantum states using quantum computing; and c) determining a decoding result corresponding to the maximum metric as an optimum decoding result.

11. The electronic device according to item 10, wherein the decoding process based on quantum computing comprises a Maximum Likelihood decoding process based on quantum computing and a Successive Cancellation List decoding process based on quantum computing, the plurality of decoding results are all possible decoding results in the Maximum Likelihood decoding process based on quantum computing, and the plurality of decoding results constitute a subset of the all possible decoding results and the step b) is performed multiple times in the Successive Cancellation List decoding process based on quantum computing.

12. The electronic device according to item 1, wherein determining the codec information for the communication between the first communication apparatus and the second communication apparatus is also based on state of a channel between the first communication apparatus and the second communication apparatus.

13. The electronic device according to item 1, wherein the processing circuitry is further configured to perform control to send the codec information to at least one of the first communication apparatus and the second communication apparatus.

14. The electronic device according to item 1, wherein the processing circuitry is further configured to perform the decoding process based on quantum computing.

15. The electronic device according to item 1, wherein the electronic device is configured as a base station or a terminal device.

16. An electronic device comprising:
processing circuitry configured to
send information usable for determining a codec capability of a second communication apparatus to communicate with a first communication apparatus;
receive codec information for communication between the first communication apparatus and the second communication apparatus, wherein the codec information is determined based on at least the codec capability of the second communication apparatus;
wherein determining the codec capability comprises determining whether the codec capability comprises a capability of performing a decoding process based on quantum computing.

17. The electronic device according to item 16, wherein the codec capability is a codec capability for a polar code.

18. The electronic device according to item 17, wherein the codec information indicates positions of message bits or frozen bits.

19. The electronic device according to item 16, wherein the codec capability comprises at least one of a maximum encoding length and a maximum decoding length, and the codec information comprises a coding length for the communication between the first communication apparatus and the second communication apparatus selected based on the codec capability, and wherein the coding length is shorter than or equal to the at least one of the maximum encoding length and the maximum decoding length.

20. The electronic device according to item 16, wherein the codec information comprises a code length threshold for selecting a decoding process at the second communication apparatus.

21. The electronic device according to item 20, wherein the code length threshold is a first code length threshold for selecting a Maximum Likelihood decoding process based on quantum computing in a case where the codec capability comprises the capability of performing the decoding process based on quantum computing, and wherein the Maximum Likelihood decoding process based on quantum computing is selected in a case where the coding length for the communication between the first communication apparatus and the second communication apparatus is shorter than or equal to the first code length threshold.

22. The electronic device according to item 21, wherein the code length threshold is a second code length threshold for selecting a classic Maximum Likelihood decoding process in a case where the codec capability does not comprise the capability of performing the decoding process based on quantum computing, and wherein the classic Maximum Likelihood decoding process is selected in a case where the coding length for the communication between the first communication apparatus and the second communication apparatus is shorter than or equal to the second code length threshold.

23. The electronic device according to item 22, wherein the first code length threshold is twice the second code length threshold.

24. The electronic device according to item 21, wherein the first code length threshold is 128.

25. The electronic device according to item 16, wherein the decoding process based on quantum computing comprises the following steps:
a) mapping a plurality of metrics corresponding to a plurality of possible decoding results to a plurality of quantum states of a set of quantum registers;
b) determining a maximum metric of the plurality of metrics mapped to the plurality of quantum states using quantum computing; and
c) determining a decoding result corresponding to the maximum metric as an optimum decoding result.

26. The electronic device according to item 25, wherein the decoding process based on quantum computing comprises a Maximum Likelihood decoding process based on quantum computing and a Successive Cancellation List decoding process based on quantum computing,
the plurality of decoding results are all possible decoding results in the Maximum Likelihood decoding process based on quantum computing, and
the plurality of decoding results constitute a subset of the all possible decoding results and the step b) is performed multiple times in the Successive Cancellation List decoding process based on quantum computing.

27. The electronic device according to item 16, wherein the processing circuitry is further configured to perform the decoding process based on quantum computing.

28. The electronic device according to item 16, wherein the electronic device is configured as a base station or a terminal device.

29. An electronic device performing a decoding process based on quantum computing, the electronic device comprises:
processing circuitry configured to
a) map a plurality of metrics corresponding to a plurality of possible decoding results to a plurality of quantum states of a set of quantum registers.
b) determine a maximum metric of the plurality of metrics mapped to the plurality of quantum states using quantum computing; and
c) determine a decoding result corresponding to the maximum metric as an optimum decoding result.

30. The electronic device according to item 29, wherein the decoding process based on quantum computing is a Maximum Likelihood decoding process based on quantum computing, and the plurality of decoding results are all possible decoding results.

31. The electronic device according to item 29, wherein the decoding process based on quantum computing is a Successive Cancellation List decoding process based on quantum computing, and the plurality of decoding results constitute a subset of the all possible decoding results and the step b) is performed multiple times.

32. A communication method comprising:
determining a codec capability of at least one of a first communication apparatus and a second communication apparatus;
determining codec information for communication between the first communication apparatus and the second communication apparatus, based on the codec capability;
wherein determining the codec capability comprises determining whether the codec capability comprises a capability of performing a decoding process based on quantum computing.

33. A communication method comprising:
sending information usable for determining a codec capability of a second communication apparatus to communicate with a first communication apparatus;
receiving codec information for communication between the first communication apparatus and the second communication apparatus, wherein the codec information is determined based on at least the codec capability of the second communication apparatus;
wherein determining the codec capability comprises determining whether the codec capability comprises a capability of performing a decoding process based on quantum computing.

34. A decoding method based on quantum computing, the method comprises:
a) mapping a plurality of metrics corresponding to a plurality of possible decoding results to a plurality of quantum states of a set of quantum registers.
b) determining a maximum metric of the plurality of metrics mapped to the plurality of quantum states using quantum computing; and
c) determining a decoding result corresponding to the maximum metric as an optimum decoding result.

35. A computer-readable storage medium with instructions stored thereon which when executed by a processor cause the processor to perform the method of any one of claims 32 to 34.

The invention claimed is:
1. An electronic device comprising:
processing circuitry configured to
determine a codec capability of at least one of a first communication apparatus and a second communication apparatus;
determine codec information for communication between the first communication apparatus and the second communication apparatus, based on the codec capability;

wherein determining the codec capability comprises determining whether the codec capability comprises a capability of performing a decoding process based on quantum computing.

2. The electronic device according to claim 1, wherein, the codec capability is a codec capability for a polar code; and
the codec information indicates positions of message bits or frozen bits.

3. The electronic device according to claim 1, wherein the codec capability comprises at least one of a maximum encoding length and a maximum decoding length, and the codec information comprises a coding length for the communication between the first communication apparatus and the second communication apparatus selected based on the codec capability, and wherein the coding length is shorter than or equal to the at least one of the maximum encoding length and the maximum decoding length.

4. The electronic device according to claim 1, wherein the codec information comprises a code length threshold for selecting a decoding process at at least one of the first communication apparatus and the second communication apparatus.

5. The electronic device according to claim 4, wherein the code length threshold is a first code length threshold for selecting a Maximum Likelihood decoding process based on quantum computing in a case where the codec capability comprises the capability of performing the decoding process based on quantum computing, and wherein the Maximum Likelihood decoding process based on quantum computing is selected in a case where the coding length for the communication between the first communication apparatus and the second communication apparatus is shorter than or equal to the first code length threshold.

6. The electronic device according to claim 5, wherein the code length threshold is a second code length threshold for selecting a classic Maximum Likelihood decoding process in a case where the codec capability does not comprise the capability of performing the decoding process based on quantum computing, and wherein the classic Maximum Likelihood decoding process is selected in a case where the coding length for the communication between the first communication apparatus and the second communication apparatus is shorter than or equal to the second code length threshold.

7. The electronic device according to claim 6, wherein the first code length threshold is twice the second code length threshold.

8. The electronic device according to claim 1, wherein the decoding process based on quantum computing comprises the following steps:
a) mapping a plurality of metrics corresponding to a plurality of possible decoding results to a plurality of quantum states of a set of quantum registers;
b) determining a maximum metric of the plurality of metrics mapped to the plurality of quantum states using quantum computing; and
c) determining a decoding result corresponding to the maximum metric as an optimum decoding result.

9. The electronic device according to claim 8, wherein the decoding process based on quantum computing comprises a Maximum Likelihood decoding process based on quantum computing and a Successive Cancellation List decoding process based on quantum computing, the plurality of decoding results are all possible decoding results in the Maximum Likelihood decoding process based on quantum computing, and the plurality of decoding results constitute a subset of the all possible decoding results and the step b) is performed multiple times in the Successive Cancellation List decoding process based on quantum computing.

10. An electronic device comprising:
processing circuitry configured to
send information usable for determining a codec capability of a second communication apparatus to communicate with a first communication apparatus;
receive codec information for communication between the first communication apparatus and the second communication apparatus, wherein the codec information is determined based on at least the codec capability of the second communication apparatus;
wherein determining the codec capability comprises determining whether the codec capability comprises a capability of performing a decoding process based on quantum computing.

11. The electronic device according to claim 10, wherein the codec capability is a codec capability for a polar code; and
the codec information indicates positions of message bits or frozen bits.

12. The electronic device according to claim 10, wherein the codec capability comprises at least one of a maximum encoding length and a maximum decoding length, and the codec information comprises a coding length for the communication between the first communication apparatus and the second communication apparatus selected based on the codec capability, and wherein the coding length is shorter than or equal to the at least one of the maximum encoding length and the maximum decoding length.

13. The electronic device according to claim 10, wherein the codec information comprises a code length threshold for selecting a decoding process at the second communication apparatus.

14. The electronic device according to claim 13, wherein the code length threshold is a first code length threshold for selecting a Maximum Likelihood decoding process based on quantum computing in a case where the codec capability comprises the capability of performing the decoding process based on quantum computing, and wherein the Maximum Likelihood decoding process based on quantum computing is selected in a case where the coding length for the communication between the first communication apparatus and the second communication apparatus is shorter than or equal to the first code length threshold.

15. The electronic device according to claim 14, wherein the code length threshold is a second code length threshold for selecting a classic Maximum Likelihood decoding process in a case where the codec capability does not comprise the capability of performing the decoding process based on quantum computing, and wherein the classic Maximum Likelihood decoding process is selected in a case where the coding length for the communication between the first communication apparatus and the second communication apparatus is shorter than or equal to the second code length threshold.

16. The electronic device according to claim 15, wherein the first code length threshold is twice the second code length threshold.

17. The electronic device according to claim 10, wherein the decoding process based on quantum computing comprises the following steps:
a) mapping a plurality of metrics corresponding to a plurality of possible decoding results to a plurality of quantum states of a set of quantum registers;

b) determining a maximum metric of the plurality of metrics mapped to the plurality of quantum states using quantum computing; and c) determining a decoding result corresponding to the maximum metric as an optimum decoding result.

18. The electronic device according to claim 17, wherein the decoding process based on quantum computing comprises a Maximum Likelihood decoding process based on quantum computing and a Successive Cancellation List decoding process based on quantum computing, the plurality of decoding results are all possible decoding results in the Maximum Likelihood decoding process based on quantum computing, and the plurality of decoding results constitute a subset of the all possible decoding results and the step b) is performed multiple times in the Successive Cancellation List decoding process based on quantum computing.

* * * * *